(12) United States Patent
Chang et al.

(10) Patent No.: US 12,512,384 B2
(45) Date of Patent: Dec. 30, 2025

(54) SEMICONDUCTOR PACKAGE WITH ELECTRICALLY CONDUCTIVE STRUCTURE AND MANUFACTURING METHOD THEREOF

(71) Applicant: Taiwan Semiconductor Manufacturing Company, Ltd., Hsinchu (TW)

(72) Inventors: Kai-Fung Chang, Taipei (TW); Sheng-Feng Weng, Taichung (TW); Ming-Yu Yen, MiaoLi County (TW); Kai-Ming Chiang, Taichung (TW); Wei-Jhan Tsai, Kaohsiung (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 567 days.

(21) Appl. No.: 17/876,558

(22) Filed: Jul. 29, 2022

(65) Prior Publication Data
US 2024/0038626 A1 Feb. 1, 2024

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4857* (2013.01); *H01L 21/56* (2013.01);
(Continued)

(58) Field of Classification Search
CPC ..... H01L 21/4857; H01L 21/56; H01L 21/78; H01L 21/561; H01L 21/568; H01L 21/6836; H01L 21/6835; H01L 23/3735; H01L 23/3128; H01L 23/49811; H01L 23/49822; H01L 23/36; H01L 23/49816; H01L 23/5389; H01L 24/29; H01L 24/32; H01L 24/94; H01L 24/05; H01L 24/13; H01L 24/16; H01L 24/73; H01L 24/24; H01L 24/19; H01L 24/20; H01L 2221/6834; H01L 2221/68345; H01L 2221/68327; H01L 2221/68359;
(Continued)

(56) References Cited

U.S. PATENT DOCUMENTS 8,993,380 B2  3/2015  Hou et al.
9,000,584 B2  4/2015  Lin et al.
(Continued)

*Primary Examiner* — Duy T Nguyen
*Assistant Examiner* — Jiyoung Oh
(74) *Attorney, Agent, or Firm* — JCIPRNET

(57) ABSTRACT

A semiconductor package includes a first redistribution circuit structure, a semiconductor die, and an electrically conductive structure. The semiconductor die is disposed over and electrically coupled to the first redistribution circuit structure. The electrically conductive structure connects a non-active side of the semiconductor die to a conductive feature of the first redistribution circuit structure, where the semiconductor die is thermally coupled to the first redistribution circuit structure through the electrically conductive structure, and the electrically conductive structure includes a structure of multi-layer with different materials.

20 Claims, 20 Drawing Sheets

US 12,512,384 B2
Page 2

(51) Int. Cl.
*H01L 21/56* (2006.01)
*H01L 21/78* (2006.01)
*H01L 23/00* (2006.01)
*H01L 23/31* (2006.01)
*H01L 23/498* (2006.01)

(52) U.S. Cl.
CPC .......... *H01L 21/78* (2013.01); *H01L 23/3128* (2013.01); *H01L 23/49811* (2013.01); *H01L 23/49822* (2013.01); *H01L 24/29* (2013.01); *H01L 24/32* (2013.01); *H01L 24/94* (2013.01); *H01L 24/05* (2013.01); *H01L 24/13* (2013.01); *H01L 24/16* (2013.01); *H01L 24/73* (2013.01); *H01L 2224/05624* (2013.01); *H01L 2224/13147* (2013.01); *H01L 2224/16227* (2013.01); *H01L 2224/29083* (2013.01); *H01L 2224/29166* (2013.01); *H01L 2224/29181* (2013.01); *H01L 2224/32225* (2013.01); *H01L 2224/73253* (2013.01); *H01L 2224/94* (2013.01)

(58) Field of Classification Search
CPC . H01L 2221/68381; H01L 2224/05624; H01L 2224/13147; H01L 2224/16227; H01L 2224/29083; H01L 2224/29166; H01L 2224/29181; H01L 2224/32225; H01L 2224/73253; H01L 2224/94

USPC ........................................................ 257/668
See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2019/0148274 A1* | 5/2019 | Yu ............................ H01L 24/83 257/668 |
| 2020/0243497 A1* | 7/2020 | Hsu ..................... H01L 21/4857 |
| 2021/0066222 A1* | 3/2021 | Chen ................. H01L 21/76879 |

* cited by examiner

SEMICONDUCTOR PACKAGE WITH ELECTRICALLY CONDUCTIVE STRUCTURE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size has decreased. This scaling down process generally provides benefits by increasing production efficiency and lowering associated costs.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 through FIG. 12A are schematic cross-sectional views of various stages in a manufacturing method of a semiconductor package in accordance with some alternative embodiments of the disclosure.

FIG. 12B through FIG. 16 are schematic cross-sectional views of various stages in a manufacturing method of a semiconductor package in accordance with some alternative embodiments of the disclosure.

DETAILED DESCRIPTION

Figure 1:
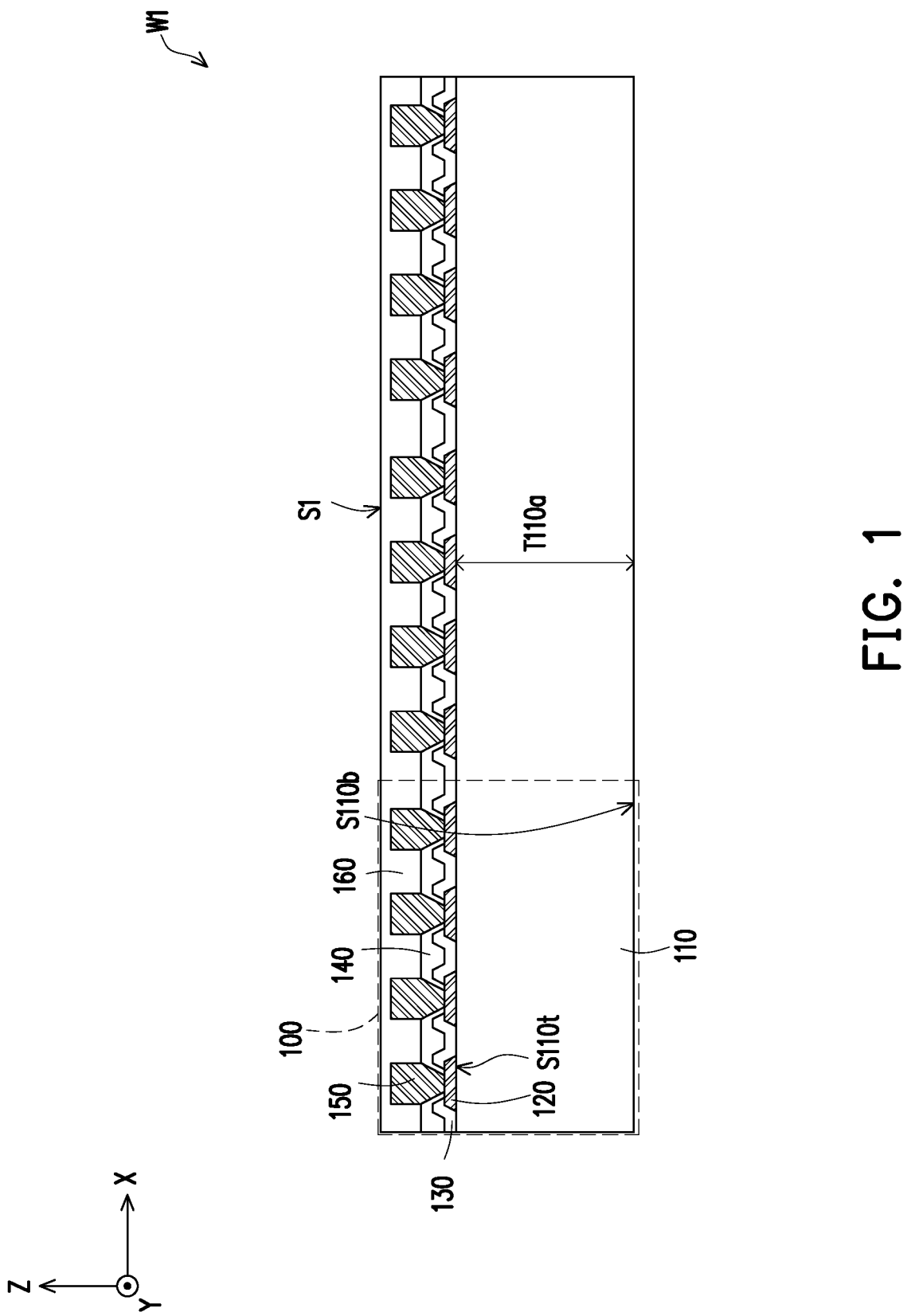
FIG. 1 through FIG. 9 are schematic cross-sectional views of various stages in a manufacturing method of a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

As used herein, "around," "about," "approximately," or "substantially" shall generally mean within 20 percent, or within 10 percent, or within 5 percent, or within 3 percent, or within 1 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The specific embodiment(s) discussed herein is merely illustrative and is related to a semiconductor package including an electrically conductive adhesive structure disposed between a rear surface of a semiconductor die/chip/device and a routing structure, and is not intended to limit the scope of the disclosure. In accordance with some embodiments, the semiconductor package includes a routing structure, a semiconductor die adhered on a routing structure through an electrically conductive adhesive structure, and an insulating encapsulation covering the semiconductor die and the routing structure. In the case, the electrically conductive adhesive structure has better thermal conduction to the semiconductor die since an eutectic bond is between the electrically conductive adhesive structure and an conductive feature of the routing structure, the heat dissipation of the semiconductor package is improved, thereby enhancing the reliability of the semiconductor package. Besides, due to the curing time of the electrically conductive adhesive structure is greatly less than the curing time of a conventional die attach film, the manufacturing time and cost of the semiconductor package is further reduced.

FIG. 1 through FIG. 9 are schematic cross-sectional views of various stages in a manufacturing method of a semiconductor package 10 in accordance with some embodiments of the disclosure. In embodiments, the manufacturing method is part of a wafer level packaging process. It is to be noted that the process steps described herein cover a portion of the manufacturing processes used to fabricate the semiconductor package involving a semiconductor component such as a semiconductor device (or die/chip) and an electrically conductive adhesive structure disposed thereon. The embodiments are intended to provide further explanations but are not used to limit the scope of the disclosure. Accordingly, it is understood that additional processes may be provided before, during, and after the illustrated method, and that some other processes may only be briefly described herein. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Referring to FIG. 1, in some embodiments, a wafer W1 including a plurality of semiconductor dies 100 arranged in an array is provided. For example, the semiconductor dies 100 are arranged in the form of a matrix (such as a N×N array or a N×M array, where N, M>0, N may or may not be equal to M) within wafer W1. Before performing a wafer sawing or dicing process on the wafer W1, the semiconductor dies 100 of the wafer W1 may be connected to one another, as shown in FIG. 1. In some embodiments, the wafer W1 includes a semiconductor substrate 110 having an active surface S110t and a rear surface (also referred to as a non-active surface) S110b opposite to the active surface S110t, a plurality of pads 120 distributed on the active surface S110t, a passivation layer 130 covering the active surface S110t and portions of the pads 120, a post-passivation layer 140 covering the passivation layer 130 and portions of the pads 120, a plurality of conductive vias 150 connecting to the pads 120 exposing by the passivation layer 130 and the post-passivation layer 140, and a protection layer 160 disposed on and covering the post-passivation layer 140 and the conductive vias 150. The pads 120, the passivation layer 130, the post-passivation layer 140, the conductive vias 150, and the protection layer 160 may be formed on the semiconductor substrate 110. In some embodiments, the pads 120 are partially exposed by the passivation layer 130 and the post-passivation layer 140, where the conductive vias 150 are respectively disposed on and electrically connected to the pads 120, and the protection layer 160 covers the post-passivation layer 140 exposed by the conductive vias 150 and illustrated top surfaces (not labeled) of the conductive vias 150 for providing protection, which avoids the conductive vias 150 of the semiconductor dies 100 from being damaged during the transportation process or the pick-and-place process.

However, the disclosure may not be limited thereto. Alternatively, the illustrated top surfaces of the conductive vias 150 may be accessibly exposed by the protection layer 160. Or alternatively, the post-passivation layer 140 and/or the protection layer 160 may be omitted. It should be noted that the number of the semiconductor dies 100 may be one or more than one, the disclosure is not limited to the drawings of the embodiments.

The conductive vias 150 and the protection layer 160 may be omitted. For example, the wafer 100 includes the semiconductor substrate 110 having the active surface S110t and the rear surface S110b opposite to the active surface S110t, the plurality of pads 120 distributed on the active surface S110t, the passivation layer 130 covering the active surface S110t and portions of the pads 120, and the post-passivation layer 140 covering the passivation layer 130 and portions of the pads 120. Alternatively, the post-passivation layer 140 may be omitted.

The material of the semiconductor substrate 110 may include a silicon substrate including active components (e.g., transistors, memories (such as N-type metal-oxide semiconductor (NMOS), P-type metal-oxide semiconductor (PMOS) devices, a combination thereof, or the like), a combination thereof, or the like) and/or passive components (e.g., resistors, capacitors, inductors, jumper, combinations thereof, or the like) formed therein or thereon. In some embodiments, such active components and passive components are formed in a front-end-of-line (FEOL) process. The semiconductor substrate 110 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant, or a combination thereof. The disclosure is not limited thereto.

Furthermore, the semiconductor substrate 110 may further include an interconnection structure or interconnect (not shown) disposed on the active surface S110t. The interconnection structure may include one or more inter-dielectric layers and one or more patterned conductive layers stacked alternately for providing routing function to the active components and the passive components embedded in or formed on the semiconductor substrate 110, where the pads 120 may be referred to as an outermost layer of the patterned conductive layers of the interconnection structure. In some embodiments, the interconnection structure is formed in a back-end-of-line (BEOL) process. The inter-dielectric layers may be silicon oxide layers, silicon nitride layers, silicon oxy-nitride layers, or dielectric layers formed by other suitable dielectric materials, and the inter-dielectric layers may be formed by deposition or the like. The patterned conductive layers may be patterned copper layers or other suitable patterned metal layers, and the patterned conductive layers may be formed by electroplating or deposition. However, the disclosure is not limited thereto. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc.

The pads 120 are aluminum pads or other suitable metal pads, for example. The conductive vias 150 are copper pads, copper alloy pillar or other suitable metal pillars containing copper metal, for example. In some embodiments, the passivation layer 130, the post-passivation layer 140, and the protection layer 160 may be a polybenzoxazole (PBO) layer, a polyimide (PI) layer or other suitable polymers. In some alternative embodiments, the passivation layer 130, the post-passivation layer 140, and the protection layer 160 may be made of inorganic materials, such as silicon oxide, silicon nitride, silicon oxynitride, or any suitable dielectric material. The material of the passivation layer 130 and the material of the protection layer 160 may be the same. Alternatively, the material of the passivation layer 130 and the material of the protection layer 160 may be different, in part or all. For example, the passivation layer 130 and the protection layer 160 independently are a silicon oxide layer, a silicon nitride layer, a silicon oxy-nitride layer, or a dielectric layer formed by other suitable dielectric materials, and the post-passivation layer 144 is a PI layer, a PBO layer, or a dielectric layer formed by other suitable polymers.

It is noted that, the semiconductor dies 100 described herein are individually referred as a semiconductor chip or an integrated circuit (IC), for example. In an alternative embodiment, the semiconductor dies 100 described herein may be individually a semiconductor device. In some embodiments, the semiconductor dies 100 each include a digital chip, an analog chip, or a mixed signal chip. In some embodiments, the semiconductor dies 100 each are a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor dies 100 each are a memory die with a controller or without a controller, where the memory die includes a single-form die such as a dynamic random access memory (DRAM) die, a static random access memory (SRAM) die, a resistive random-access memory (RRAM) die, a magnetoresistive random-access memory (MRAM) die, a NAND flash memory, a wide I/O memory (WIO); a pre-stacked memory cube such as a hybrid memory cube (HMC) module, a high bandwidth memory (HBM) module; a combination thereof; or the like. In further alternative embodiments, the semiconductor dies 100 each are an artificial intelligence (AI) engine such as an AI accelerator; a computing system such as an AI server, a high-performance computing (HPC) system, a high-power computing device, a cloud computing system, a networking system, an edge computing system, a immersive memory computing system (ImMC), a system-on-integrated-circuit (SoIC) system, etc.; a combination thereof; or the like. In yet alternative embodiments, the semiconductor dies 100 each are an electrical and/or optical input/output (I/O) interface die, an integrated passives die (IPD), a voltage regulator (VR) die, a local silicon interconnect (LSI) die with or without deep trench capacitor (DTC) features, a LSI die with multi-tier functions such as electrical and/or optical network circuit interfaces, IPD, VR, DTC, or the like. Alternatively, the semiconductor dies 100 each may be referred to as a chip or an IC of combination-type, such as a WiFi chip simultaneously including both of a RF chip and a digital chip. The type of the semiconductor dies 100 may be selected and designated based on the demand and design requirement, and thus is not specifically limited in the disclosure. As illustrated in FIG. 1, for example, a thickness T110a of the semiconductor substrate 110 is approximately in a range of 200 µm to 800 µm.

In certain embodiments, additional semiconductor die(s) of the same type or different types may be included. The additional semiconductor die(s) may include digital chips, analog chips, or mixed signal chips, such as ASIC chips, sensor chips, wireless and RF chips, memory chips, logic chips, voltage regulator chips, or the like. The disclosure is not limited thereto. It should be appreciated that the illustration of the semiconductor dies 100 and other components throughout all figures is schematic and is not in scale.

Figure 2:
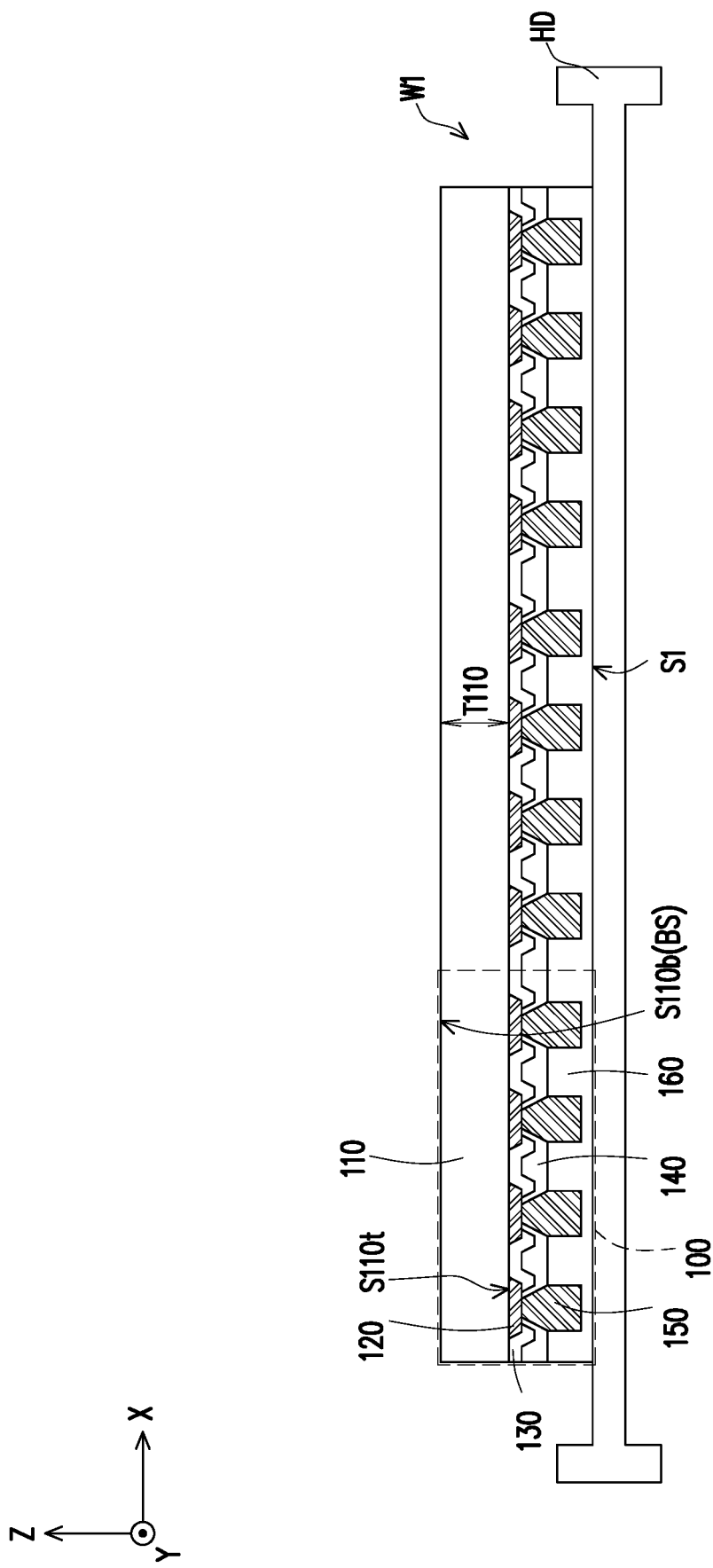

Referring to FIG. 1 and FIG. 2, in some embodiments, the wafer W1 is flipped (turned upside down) and placed onto a holding device HD, and the semiconductor substrate 110 is thinned. For example, a top surface S1 of the wafer W1 is mounted on the holding device HD, and the semiconductor substrate 110 is globally thinned down from the rear surface S110b by a planarization process. In some embodiments, a thinned thickness T110 of the semiconductor substrate 110 may approximately range from 20 µm to 720 µm. In some embodiments, the planarizing process may include a grinding process, a chemical mechanical polishing (CMP) process, an etching process, or combinations thereof. The etching process may include a dry etching, a wet etching, or a combination thereof. However, the disclosure is not limited thereto, and the planarizing step may be performed through any other suitable method. After the planarizing process, a cleaning step may be optionally performed, for example to clean and remove the residue generated from the planarizing process. In some embodiments, the holding device HD is or includes an adhesive tape, a carrier film or a suction pad being supported by a frame. After thinning, the rear surface S110b of the semiconductor substrate 110 may be referred to as a backside surface BS of the wafer W1 or each of the semiconductor dies 100.

Figure 3:
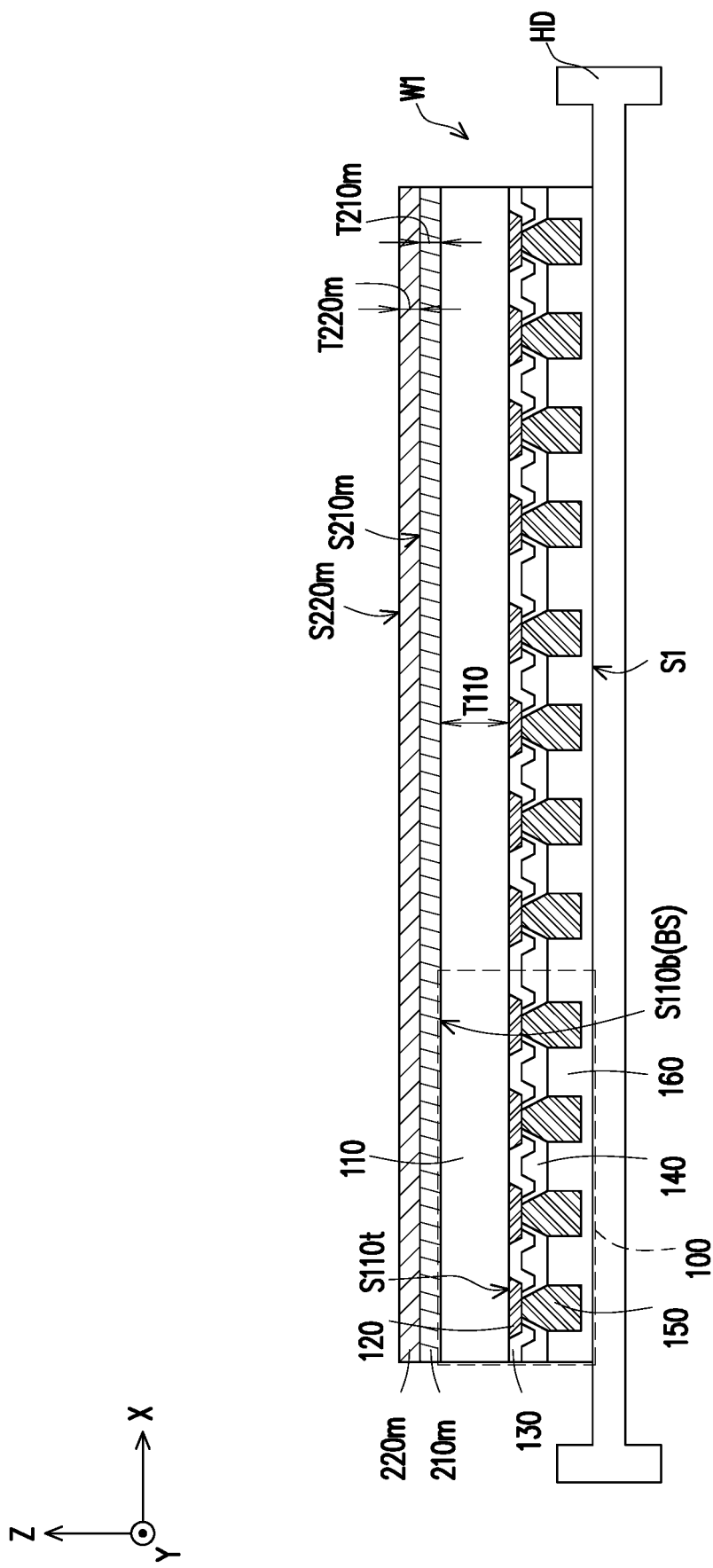

Referring to FIG. 3, in some embodiments, a conductive material 210m is conformally formed on the rear surface S110b of the semiconductor substrate 110, and a conductive material 220m is conformally formed on an illustrated top surface S210m of the conductive material 210m. The conductive material 210m may be disposed between the semiconductor substrate 110 and the conductive material 220m, as shown in FIG. 3. For example, the conductive material 210m connects (e.g., is in physical contact with) the semiconductor substrate 110 and the conductive material 220m. In some embodiments, as shown in FIG. 3, an illustrated top surface S220m of the conductive material 220m provides a high degree of coplanarity and flatness. Due to the high degree of coplanarity and flatness, the formation of the later-formed layer(s) and/or element(s) is beneficial.

The conductive material 210m is different from the conductive material 220m, for example. The conductive material 210m may have a thickness T210m of about 0.01 µm to about 10 µm as measured along the direction Z, although other suitable thickness may alternatively be utilized. For example, a material of the conductive material 210m includes Ti, Ta, or the like, which is formed by suitable fabrication techniques such as a plating process (e.g., electroplating or electroless plating) or the like. The conductive material 220m may have a thickness T220m of about 0.01 µm to about 50 µm as measured along the direction Z, although other suitable thickness may alternatively be utilized. For example, a material of the conductive material 220m includes Au, In, Cu, Sn, Ge, Al, or the like, which is formed by suitable fabrication techniques such as a sputtering process, plating process (e.g., electroplating or electroless plating) or the like.

Figure 4:
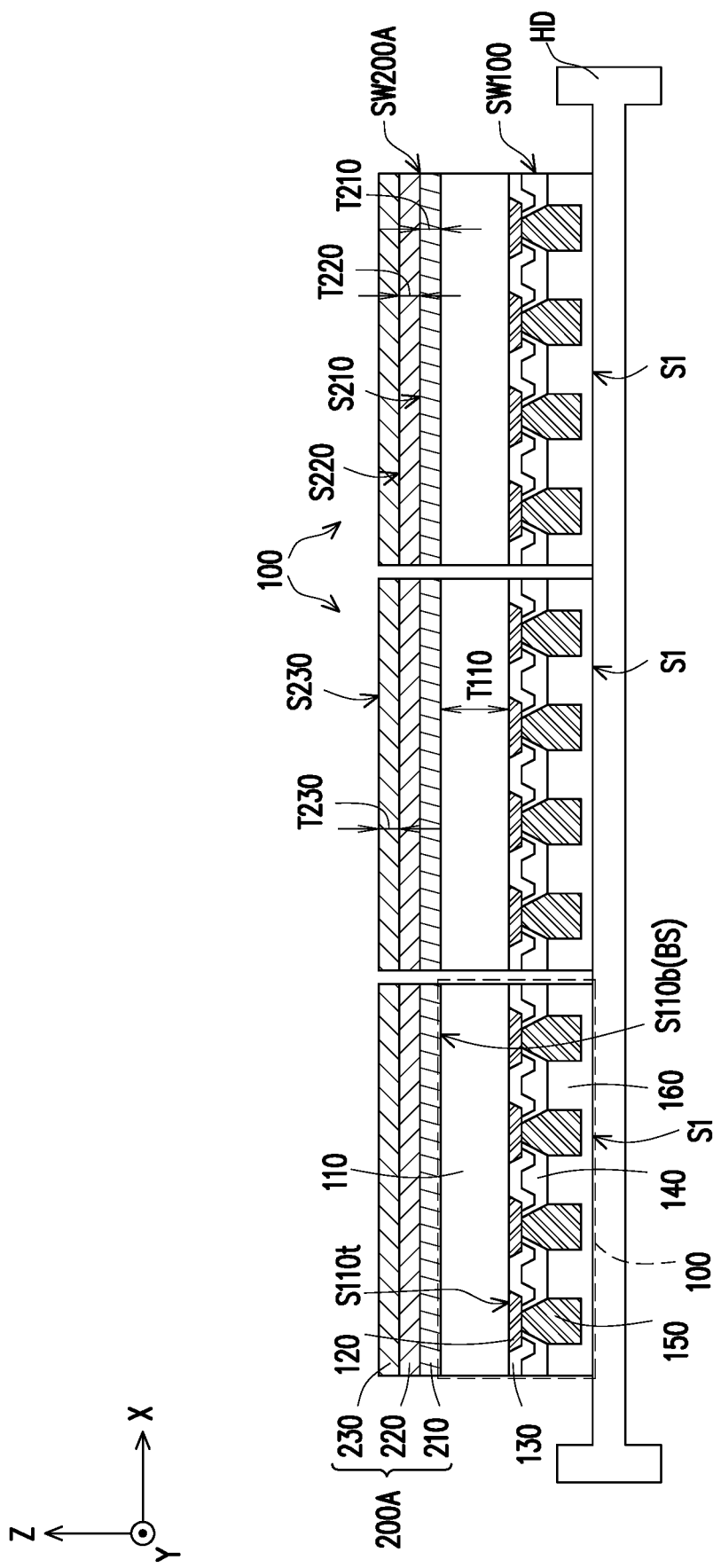

Referring to FIG. 4, in some embodiments, a dicing (or singulation) process is sequentially performed to form individual and separated semiconductor dies 100, where each of the semiconductor dies 100 is disposed with an electrically conductive structure (also referred to as an electrically conductive adhesive structure) 200A at the rear surface S110b thereof. In one embodiment, the singulation process is a wafer dicing process including mechanical blade sawing or laser cutting. The disclosure is not limited thereto. As shown in FIG. 4, for each semiconductor die 100, a sidewall SW200A of the electrically conductive structure 200A is substantially aligned with a sidewall SW100 of the semiconductor die 100, in the direction Z.

In one embodiments, the formation of the semiconductor dies 100 disposed with an electrically conductive structure 200A includes, but not limited to, by forming a first conductive material (not shown) on the illustrated top surface S220m of the conductive material 220m by printing; then, dicing the resulting structure by cutting through the wafer W1, the conductive material 210m, the conductive material 220m, and the first conductive material to form the semiconductor dies 100, a conductive layer 210, a conductive layer 220, and a conductive layer 230, respectively. The printing may also be recognized as a stencil printing technique. In an alternative embodiments, the formation of the semiconductor dies 100 disposed with an electrically conductive structure 200A includes, but not limited to, by dicing the whole structure depicted in FIG. 3 by cutting through the wafer W1, the conductive material 210m and the conductive material 220m to form the semiconductor dies 100, a conductive layer 210 and a conductive layer 220, respectively; then, dipping a surface (e.g., the illustrated top surface S220m) of the resulting structure (after dicing) into a bath of a first conductive material (not shown) to form a conductive layer 230 on the conductive layer 220. The conductive layer 210, the conductive layer 220 and the conductive layer 230 together constitute one electrically conductive structure 200A, in some embodiments. The conductive layer 210, the conductive layer 220 and the conductive layer 230 are electrically connected and thermally connected to each other, in each electrically conductive structure 200A. For a non-limiting example, if considering the conductive layer 230 is made of Sn, a thermal conductivity of the electrically conductive structure 200A is greater than or substantially equal to 50 W/(m·k).

The conductive layer 210 may have a thickness T210 of about 0.01 µm to about 10 µm as measured along the direction Z, although other suitable thickness may alternatively be utilized. The conductive layer 220 may have a thickness T220 of about 0.01 µm to about 50 µm as measured along the direction Z, although other suitable thickness may alternatively be utilized. The conductive layer 230 may have a thickness T230 of about 0.01 µm to about 100 µm as measured along the direction Z, although other suitable thickness may alternatively be utilized. For example, a material of the first conductive material used to form the conductive layer 230 includes Au, In, Cu, Sn, Ge, Al, or the like, which is formed by suitable fabrication techniques such as a plating process (e.g., electroplating or electroless plating) or the like. In some embodiments, the material of the conductive layer 210 is different from the material of the conductive layer 220 and the material of the conductive layer 230, and the material of the conductive layer 220 is different from the material of the conductive layer 230. For a non-limiting example, the conductive layer 210 is made of Ti, the conductive layer 220 is made of Cu, and the conductive layer 230 is made of Sn. That is, the electrically conductive structure 200A includes a structure of multi-layer with different materials, in some embodiments.

In some embodiment, the thickness T210 of the conductive layer 210 is less than the thickness T220 of the conductive layer 220 and the thickness T230 of the conductive layer 230, and the thickness T220 of the conductive layer 220 is less than the thickness T230 of the conductive layer 230. Alternatively, the thickness T210 of the conductive layer 210 may be less than the thickness T220 of the conductive layer 220 and the thickness T230 of the conductive layer 230, and the thickness T220 of the conductive layer 220 may be greater than the thickness T230 of the conductive layer 230. Or alternatively, the thickness T210 of the conductive layer 210 may be less than the thickness T220 of the conductive layer 220 and the thickness T230 of the conductive layer 230, and the thickness T220 of the conductive layer 220 may be substantially equal to the thickness T230 of the conductive layer 230.

In other embodiment, the thickness T210 of the conductive layer 210 is greater than the thickness T220 of the conductive layer 220 and the thickness T230 of the conductive layer 230, and the thickness T220 of the conductive layer 220 is less than the thickness T230 of the conductive layer 230. Alternatively, the thickness T210 of the conductive layer 210 may be greater than the thickness T220 of the conductive layer 220 and the thickness T230 of the conductive layer 230, and the thickness T220 of the conductive layer 220 may be greater than the thickness T230 of the conductive layer 230. Or alternatively, the thickness T210 of the conductive layer 210 may be greater than the thickness T220 of the conductive layer 220 and the thickness T230 of the conductive layer 230, and the thickness T220 of the conductive layer 220 may be substantially equal to the thickness T230 of the conductive layer 230.

In further embodiment, the thickness T210 of the conductive layer 210 is substantially equal to the thickness T220 of the conductive layer 220 and the thickness T230 of the conductive layer 230, and the thickness T220 of the conductive layer 220 is less than the thickness T230 of the conductive layer 230. Alternatively, the thickness T210 of the conductive layer 210 may be substantially equal to the thickness T220 of the conductive layer 220 and the thickness T230 of the conductive layer 230, and the thickness T220 of the conductive layer 220 may be greater than the thickness T230 of the conductive layer 230. Or alternatively, the thickness T210 of the conductive layer 210 may be substantially equal to the thickness T220 of the conductive layer 220 and the thickness T230 of the conductive layer 230, and the thickness T220 of the conductive layer 220 may be substantially equal to the thickness T230 of the conductive layer 230.

As shown in FIG. 4, the conductive layer 210 may be disposed between (e.g., in physical contact with) the semiconductor substrate 110 and the conductive layer 220, and the conductive layer 220 may be disposed between (e.g., in physical contact with) the conductive layer 210 and the conductive layer 230. For example, the conductive layer 210 directly covers the rear surface S110b of the semiconductor substrate 110, the conductive layer 220 directly covers a surface S210 of the conductive layer 210, and the conductive layer 230 directly cover a surface S220 of the conductive layer 220. In some embodiments, as shown in FIG. 4, a surface S230 of the conductive layer 230 provides a high degree of coplanarity and flatness. Due to the high degree of coplanarity and flatness, sequential process may be beneficial/facilitated. Only three semiconductor dies 100 are shown in FIG. 4 for illustrative purposes, however the number of the semiconductor dies 100 is not limited thereto, and should be selected and/or designated, depending on the demand and design layout/requirements. The conductive layer 210 may be referred to as a conductive adhesive layer or a metallization adhesive layer of the electrically conductive structure 200A. The conductive layer 220 may be referred to as a first conductive heat dissipator, a first metallization layer or a first metallization heat dissipator of the electrically conductive structure 200A. The conductive layer 230 may be referred to as a second metallization layer, a second conductive heat dissipator or a second metallization heat dissipator of the electrically conductive structure 200A.

Figure 5:
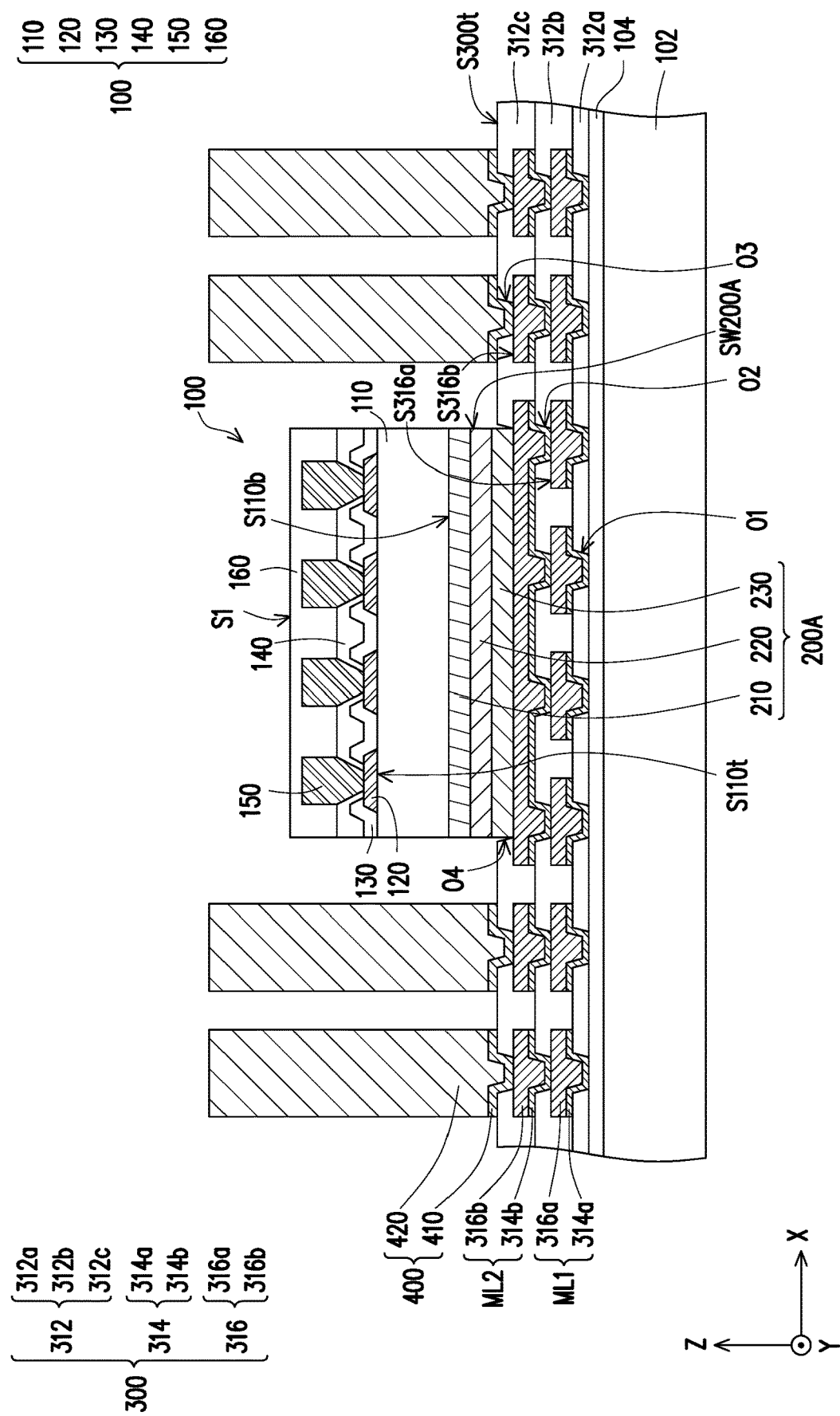

Referring to FIG. 5, in some embodiments, a carrier 102 is provided, where a redistribution circuit structure 300, a plurality of conductive pillars 400 and the semiconductor die 100 disposed with the electrically conductive structure 200A (depicted in FIG. 4) are disposed over the carrier 102. The details of the semiconductor die 100 have been previously described in FIG. 1, the details of the electrically conductive structure 200A have been previously described in FIG. 2 through FIG. 4, and thus are not repeated herein for brevity. In some embodiments, the carrier 102 is or includes a glass carrier, a ceramic carrier, or any suitable carrier for carrying a semiconductor wafer or a reconstituted wafer for the manufacturing method of the semiconductor package 10. The carrier 102 may be a reclaim wafer or a reconstituted wafer for the manufacturing method of the semiconductor package 10. For example, a release layer 104 is formed on the carrier 102. The release layer 104 may be formed of a polymer-based material (such as benzocyclobutene (BCB), PBO, or the like), which may be removed along with the carrier 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 is an ultra-violet (UV) glue, which loses its adhesive property when exposed to UV lights. The release layer 104 may be dispensed as a liquid and cured, may be a lamination film laminated onto the carrier 102, or may be the like. An illustrated top surface of the release layer 104, which is opposite to an illustrated bottom surface contacting the carrier 102, may be leveled. For example, the illustrated top surface of the release layer 104 has high coplanarity to facilitate forming processes of the overlying structures. For example, the release layer 104 is a LTHC layer with good chemical resistance, and such layer enables room temperature debonding from the carrier 102 by applying laser irradiation, however the disclosure is not limited thereto.

As shown in FIG. 5, the redistribution circuit structure 300 may be formed on the release layer 104 and over the carrier 102, where the release layer 104 may be disposed between the carrier 102 and the redistribution circuit structure 300. The redistribution circuit structure 300 is disposed between the release layer 104 and the conductive pillars 400 and between the release layer 104 and the semiconductor die 100, for example. In the case, the electrically conductive structure 200A is interposed between the semiconductor 100 and the redistribution circuit structure 300. In some embodiments, the redistribution circuit structure 300 includes one or more dielectric layers 312 (including a dielectric layer 312a, a dielectric layer 312b, and a dielectric layer 312c) and one or more metallization layers ML1, ML2 alternatively arranged along the direction Z. In the case, the metallization layers ML1, ML2 each includes a seed layer 314 (e.g., a seed layer 314a or a seed layer 314b) and a patterned conductive layer 316 (e.g., a patterned conductive layer 316a or a seed layer 316b) overlying the seed layer 314. In other words, the dielectric layers 312, the seed layers 314 and the patterned conductive layers 316 are sequentially stacked over the release layer 104. As shown in FIG. 5, the metallization layer ML1 (including the seed layer 314a and the patterned conductive layer 316a electrically connected and overlying thereto) is disposed between the dielectric layer 312a and the dielectric layer 312b, where portions of an illustrated bottom surface of the seed layer 314a are accessibly revealed by a plurality of openings O1 formed in the dielectric layer 312a, portions of an illustrated top surface S316a of the patterned conductive layer 316a are accessibly revealed by a plurality of openings O2 formed in the dielectric layer 312b, for example. In the case, the metallization layer ML2 (including the seed layer 314b and the patterned conductive layer 316b electrically connected and overlying thereto) is disposed between the dielectric layer 312b and the dielectric layer 312c, where portions of an illustrated bottom surface of the seed layer 314b are accessibly revealed by the openings O2 formed in the dielectric layer 312b, portions of an illustrated top surface S316b of the patterned conductive layer 316a are accessibly revealed by a plurality of openings O3 and at least one opening O4 formed in the dielectric layer 312c. The metallization layer ML1 and the dielectric layer 312a may be collectively referred to as a first build-up layer of the redistribution circuit structure 300, the metallization layer ML2 and the dielectric layer 312b may be collectively referred to as a first build-up layer of the redistribution circuit structure 300, and the dielectric layer 312c may be referred to as a passivation layer of the redistribution circuit structure 300. The number of the build-up layers included in the redistribution circuit structure 300 may be one, two, three or more based on the demand and design layout/requirements, and is not limited in the disclosure.

The redistribution circuit structure 300 may be formed by, but not limited to, forming a blanket layer of first dielectric material over the illustrated top surface of the release layer 104 to completely cover the release layer 104; patterning the first dielectric material blanket layer to form the dielectric layer 312a with the openings O1 exposing portions of the release layer 104 underneath thereto; forming a blanket layer of first seed layer material over the dielectric layer 312a and extending into the openings O1 formed in the dielectric layer 312a, so that the first seed layer material blanket layer penetrates through the dielectric layer 312a and lines sidewalls of the openings O1; forming a blanket layer of second conductive material over the dielectric layer 312a to completely cover the first seed layer material blanket layer and patterning the second conductive material blanket layer to form the patterned conductive layer 316a; using the patterned conductive layer 316a as an etching mask to pattern the first seed layer material blanket layer and form the seed layer 314a, so to form the metallization layer ML1 over the dielectric layer 312a; forming a blanket layer of second dielectric material over the illustrated top surface of the patterned conductive layer 316a to completely cover the patterned conductive layer 316a and the dielectric layer 312a exposed therefrom; patterning the second dielectric material blanket layer to form the dielectric layer 312b with the openings O2 exposing portions of the patterned conductive layer 316a underneath thereto; forming a blanket layer of second seed layer material over the dielectric layer 312b and extending into the openings O2 formed in the dielectric layer 312b, so that the second seed layer material blanket layer penetrates through the dielectric layer 312b and lines sidewalls of the openings O2; forming a blanket layer of third conductive material over the dielectric layer 312b to completely cover the second seed layer material blanket layer and patterning the third conductive material blanket layer to form the patterned conductive layer 316b; using the patterned conductive layer 316b as an etching mask to pattern the second seed layer material blanket layer and form the seed layer 314b, so to form the metallization layer ML2 over the dielectric layer 312b; forming a blanket layer of third dielectric material over the illustrated top surface of the patterned conductive layer 316b to completely cover the patterned conductive layer 316b and the dielectric layer 312b therefrom; and patterning the third dielectric material blanket layer to form the dielectric layer 312c with the openings O3 and O4 exposing portions of the patterned conductive layer 316a underneath thereto. Upon this, the redistribution circuit structure 300 is manufactured.

The material of each of the dielectric layers 312a, 312b, and 312c may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The first, second, and/or third dielectric material blanket layer may be formed by suitable fabrication techniques such as spin-on coating, chemical vapor deposition (CVD), (e.g., plasma-enhanced chemical vapor deposition (PECVD)), or the like. In one embodiment, the materials of the dielectric layers 312a, 312b, and 312c are the same to each other. Alternatively, the materials of the dielectric layers 312a, 312b, and 312c may be different from one another, in part or all.

The seed layers 314a and 314b are individually referred to as a metal layer, which can be a single layer or a composite layer including a plurality of sub-layers formed of different materials. For example, the seed layers 314a and 314b each may be or include a titanium layer and a copper layer over the titanium layer. The first and/or second seed layer material blanket layers may be formed in a manner of a blanket layer made of metal or metal alloy materials, the disclosure is not limited thereto. The material of each of the first and/or second seed layer material blanket layers may include titanium, copper, molybdenum, tungsten, titanium nitride, titanium tungsten, combinations thereof, or the like, which may be formed using, for example, sputtering, physical vapor deposition (PVD), or the like. The first and/or second seed layer material blanket layers may be patterned by etching, such as a dry etching process, a wet etching process, or a combination thereof; the disclosure is not limited thereto. In one embodiment, the materials of the seed layers 314a and 314b are the same to each other. Alternatively, the materials of the seed layers 314a and 314b may be different to one another.

The material of each of the second and third conductive material blanket layers for forming the patterned conductive layers 316a and 316b may be made of conductive materials formed by electroplating or deposition, such as copper, copper alloy, aluminum, aluminum alloy, or combinations thereof, which may be patterned to form a plurality of conductive patterns/segments using a photolithography and etching process. In some embodiments, the conductive patterns/segments each include a line portion extending along a horizontal direction (e.g., the direction X and/or Y) and/or a line portion extending along a horizontal direction (e.g., the direction X and/or Y) in addition to a via portion connecting to the line portion and extending along a vertical direction (e.g., the direction Z). The directions X, Y and Z may be different from each other. For example, the directions X, Y and Z are perpendicular to each other. In one embodiment, the materials of the patterned conductive layers 316a and 316b are the same to each other. Alternatively, the materials of the patterned conductive layers 316a and 316b may be different to one another.

In some embodiments, in each of the metallization layers ML1 and ML2, sidewalls of the seed layer 314 are substantially aligned with sidewalls of the patterned conductive layer 316, for example. In other words, in each metallization layer ML1 or ML2, the seed layer 314 and the patterned conductive layer 316 share the same contour, in a vertical projection on the carrier 102 along the direction Z. In some embodiments, the metallization layers ML1 and ML2 are physically connected to each other. The metallization layers ML1 and ML2 may be referred to as redistribution (or routing) layers, redistribution (or routing) lines, or redistribution (or routing) wires of the redistribution circuit structure 300, and the dielectric layers 312 (including 312a-312c) collectively may be referred to as a dielectric structure of the redistribution circuit structure 300. The redistribution circuit structure 300 may be referred to as a backside redistribution circuit structure or backside redistribution structure of the semiconductor die 100, in the semiconductor package 10. However, in the disclosure, the numbers of the dielectric layers 312, the seed layers 314 and the patterned conductive layers 316 are not limited to the drawing of FIG. 5, where the number of each of the dielectric layers 312, the seed layers 314 and the patterned conductive layers 316 may be one, two, three or more than three as long as the redistribution circuit structure 300 can provide a sufficient routing function to the semiconductor die 100.

Continued on FIG. 5, the conductive pillars 400 may be formed on an outermost surface S300t of the redistribution circuit structure 300. In some embodiments, each of the conductive pillars includes a seed layer 410 and a conductive via 420 overlying and electrically connecting to the seed layer 410. For example, in each conductive pillar 400, the conductive vias 420 is disposed on (e.g., in physical contact with) the seed layer 410, where the seed layer 410 extends into a respective one opening O3 to be connected to the redistribution circuit structure 300 (e.g., the patterned conductive layer 316a). As shown in FIG. 5, for each conductive pillar 400, a portion of the conductive via 420 may further extend into the respective one opening O3 to be in contact with the seed layer 410. In the case, the conductive vias 420 of the conductive pillars 400 are electrically coupled to the redistribution circuit structure 300 through the seed layers 410. In some embodiments, the conductive pillars 400 are arranged along but not on a cutting line (not shown) between two semiconductor packages 10. The conductive pillars 400 may be referred to as through integrated fan-out (InFO) vias, vertical connectors, or vertical connections. In some embodiments, the conductive pillars 400 are physically connected to and electrically connected to the redistribution circuit structure 300. The seed layers 410 may include a plurality of conductive segments separated from one another. That is to say, a sidewall of the conductive vias 420 may be substantially aligned with sidewalls of the seed layers 410. For example, the conductive vias 420 and the seed layers 410 share the same geometrical shape on the top view, e.g., in the vertical projection on the X-Y plane.

The conductive pillars 400 may be formed by, but not limited to, forming a blanket layer of third seed layer material over the redistribution circuit structure 300 and extending into the openings O3 formed in the dielectric layer 312c, so that the third seed layer material blanket layer penetrates through the dielectric layer 312c and lines sidewalls of the openings O3; forming a photo resist (not shown) over the third seed layer material blanket layer; patterning the photo resist to form a plurality of openings (not shown) penetrating the photo resist and exposing at least portions of the third seed layer material blanket layer corresponding to (e.g., overlapped with) the openings O3; forming a fourth conductive material (not shown) in the openings formed in the patterned photo resist to be in (physical) contact with the exposed portions of the third seed layer material blanket layer to form the conductive vias 420 (e.g., by plating (such as electroplating or electroless plating) or the like); removing the patterned photo resist (e.g., by acceptable ashing process and/or photoresist stripping process (such as using an oxygen plasma or the like)); and using the conductive vias 420 as an etching mask to pattern the third seed layer material blanket layer and form the seed layers 410.

The formation and material of each of the third seed layer material blanket layer and the seed layers 410 are similar to or substantially identical to the formation and material of each of the first/second seed layer material blanket layers and the seed layers 314a, 314b as previously described, and thus are not repeated herein for brevity. A material of the conductive vias 420 may include a metal material such as copper or copper alloys, or the like. The photo resist may be formed by spin coating or the like, and may be exposed to light for patterning. In some embodiments, a material of the photo resist includes a positive resist material or a negative resist material, that is suitable for a patterning process such as a photolithography process with a mask or a mask-less photolithography process (such as an electron-beam (e-beam) writing or an ion-beam writing). For simplification, only four conductive pillars 400 are presented in FIG. 5 for illustrative purposes, however, it should be noted that more than four conductive pillars 400 may be formed; the disclosure is not limited thereto. The number of the conductive pillars 400 can be selected based on the demand and design requirements, and may be adjusted by changing the number of the openings O3 formed in the dielectric layer 312c of the redistribution circuit structure 300.

As illustrated in FIG. 5, at least one of the semiconductor dies 100 (depicted in FIG. 4) is disposed on the redistribution circuit structure 300 and next to the conductive pillars 400, for example. In some embodiments, the semiconductor die 100 is picked and placed over the redistribution circuit structure 300 and located on the outermost surface S300t of the redistribution circuit structure 300, where the semiconductor die 100 is laterally distant from the conductive pillars 400. In some embodiments, the semiconductor die 100 is bonded to the redistribution circuit structure 300 by adhering onto the patterned conductive layer 316b of the redistribution circuit structure 300 exposed by the opening O4 formed in the dielectric layer 312c with the electrically conductive structure 200A. The semiconductor die 100 (e.g., the rear surface S110b of the semiconductor substrate 110) may be adhered to the surface S316b of the patterned conductive layer 316b directly by the electrically conductive structure 200A. For example, as shown in FIG. 5, the electrically conductive structure 200A is disposed in the opening O4 formed in the dielectric layer 312c and sandwiched between the semiconductor die 100 and the redistribution circuit structure 300. Owing to the electrically conductive structure 200A, the semiconductor die 100 is stably adhered to and thermally coupled to the redistribution circuit structure 300.

In some embodiments, after placing the semiconductor die 100 onto the redistribution circuit structure 300 so as to physical contact the conductive layer 230 of the electrically conductive structure 200A with the patterned conductive layer 316b exposed by the opening O4 formed in the dielectric layer 312c, a bonding process is performed to form an eutectic bond between metal atoms included in the conductive layer 230 of the electrically conductive structure 200A and metal atoms included in the patterned conductive layer 316b of the redistribution circuit structure 300, thereby stably adhering the semiconductor die 100 to the redistribution circuit structure 300 through the electrically conductive structure 200A. For a non-limiting example, if considering the conductive layer 230 is made of Sn and the patterned conductive layer 316b is made of Cu, there is an eutectic bond of Sn and Cu at an interface of the conductive layer 230 and the patterned conductive layer 316b, where the bonding process includes a reflow process. With the electrically conductive structure 200A, a heat dissipating path from the semiconductor substrate 110 of the semiconductor die 100 to the metallization layers ML1, ML2 of the redistribution circuit structure 300 is established, thereby obtaining a better efficiency for heat dissipating to the semiconductor die 100 included in the semiconductor package 10. In some embodiments, the sidewall SW200A of the electrically conductive structure 200A is free from the dielectric layer 312c of the redistribution circuit structure 300, as shown in FIG. 5. However, the disclosure is not limited thereto; alternatively, the sidewall SW200A of the electrically conductive structure 200A may be partially covered by the dielectric layer 312c of the redistribution circuit structure 300. Or, the sidewall SW200A of the electrically conductive structure 200A may be completely covered by the dielectric layer 312c of the redistribution circuit structure 300.

In some embodiments, the semiconductor die 100 and the conductive pillars 400 are arranged next to each other along the X-Y plane. In other words, the semiconductor die 100 do not overlap with the conductive pillars 400 in the direction Z, but are overlapped with each other in the direction X and/or the direction Y. In one embodiment, a height of the conductive pillars 400 is greater than a height of the semiconductor die 100, as shown in FIG. 5. Alternatively, the height of the conductive pillars 400 may be less than or substantially equal to the height of the semiconductor die 100. Only one semiconductor die 100 is shown in FIG. 5 for illustrative purposes and simplicity, however the number of the semiconductor die 100 is not limited thereto, and should be selected and/or designated, depending on the demand and design layout/requirements.

Figure 6:
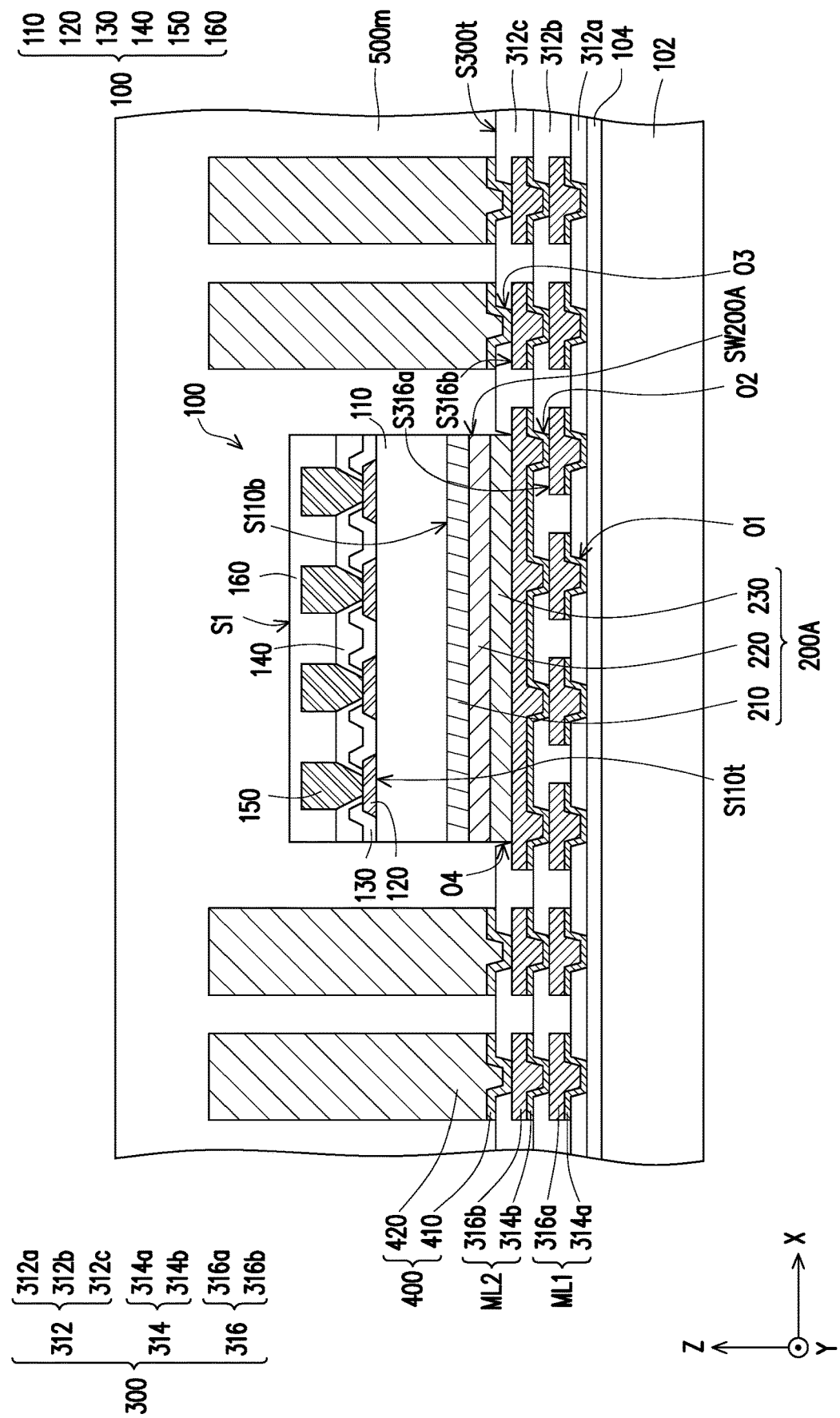

Referring to FIG. 6, in some embodiments, an encapsulation material 500m is formed on the redistribution circuit structure 300 to encapsulate the conductive pillars 400 and the semiconductor die 100. The conductive pillars 400 and the semiconductor die 100 are embedded in the encapsulation material 500m, and the redistribution circuit structure 300 exposed by the conductive pillars 400 and the semiconductor die 100 is covered by the encapsulation material 500m, for example. In other words, the conductive pillars 400 and the protection layer 160 of the semiconductor die 100 may be not accessibly revealed and are well-protected by the encapsulation material 500m. In some embodiments, the encapsulation material 500m is a molding compound, a molding underfill, a resin (such as epoxy), or the like. The encapsulation material 500m may be formed by a molding process, such as a compression molding process or a transfer molding process. In some embodiments, the encapsulation material 500m may further include inorganic filler or inorganic compound (e.g. silica, clay, and so on) which can be added therein to optimize coefficient of thermal expansion (CTE) of the encapsulation material 500m. The disclosure is not limited thereto.

Figure 7:
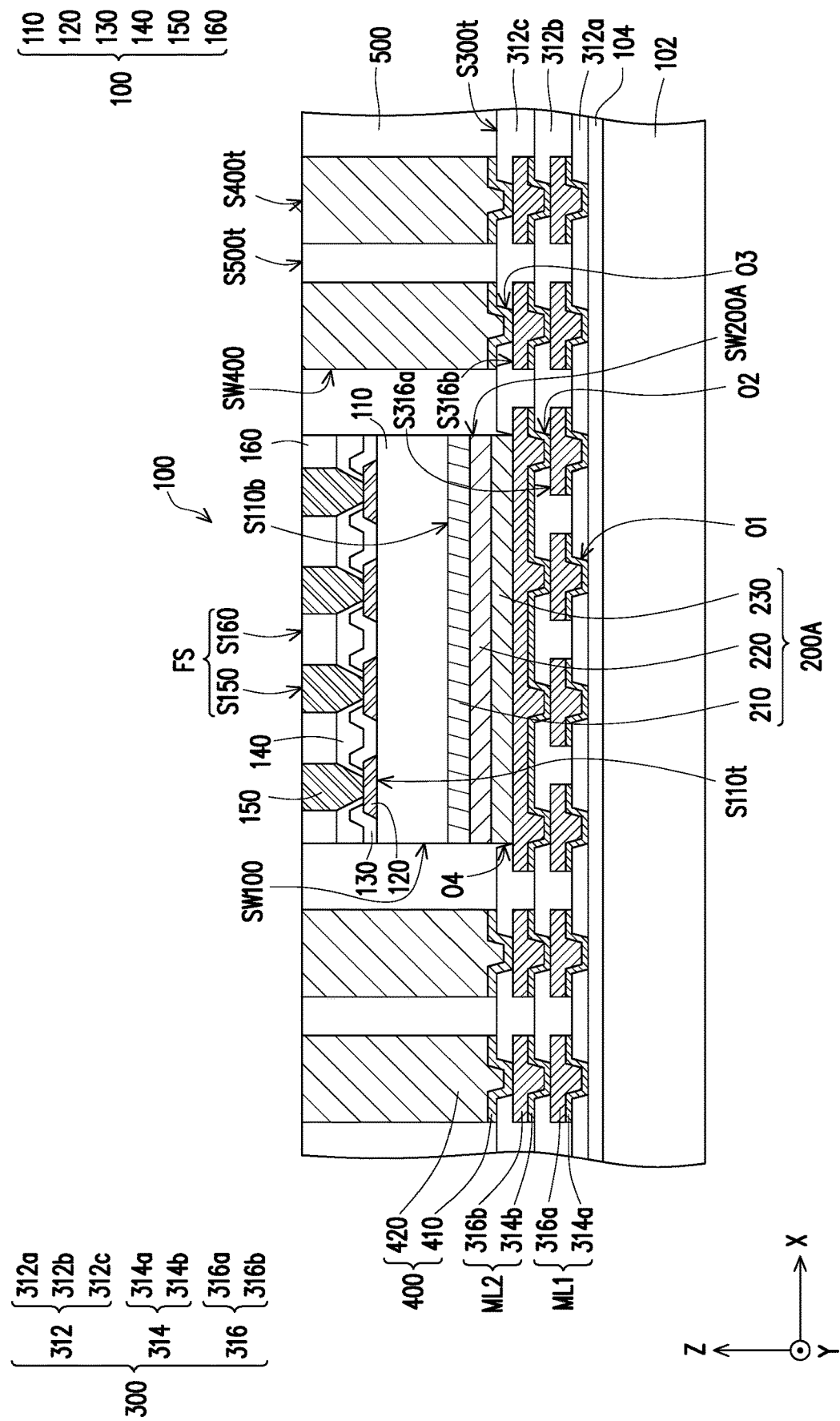

Referring to FIG. 6 and FIG. 7, in some embodiments, the encapsulation material 500m are planarized to form an insulating encapsulation 500 exposing the conductive pillars 400 and the semiconductor die 100. The insulating encapsulation 500 is disposed over the redistribution circuit structure 300 to laterally encapsulate the semiconductor die 100 and the conductive pillars 400, for example, as shown in FIG. 7. In some embodiments, the encapsulation material 500m is planarized by a mechanical grinding process and/or a CMP process. In some embodiments, during the planarizing process of the encapsulation material 500m, the protection layer 160 is planarized to accessibly reveal the conductive vias 150. In some embodiments, portions of the conductive vias 150 and portions of the conductive pillars 400 are slightly planarized as well. As shown in FIG. 7, a surface S150t of the insulating encapsulation 500 is substantially leveled with surfaces S150 of the conductive vias 150 and a surface S160 of the protection layer 160 of the semiconductor die 100 and surfaces S400t of the conductive pillars 400, for example. In some embodiments, the surface S500t of the insulating encapsulation 500, the surfaces S400t of the conductive pillars 400, and the surfaces S150 of the conductive vias 150 and the surface S160 of the protection layer 160 of the semiconductor die 100 are substantially coplanar to each other. The surfaces S150 of the conductive vias 150 and the surface S160 of the protection layer 160 together may be referred to as a frontside surface (or an active side) FS of the semiconductor die 100, and the rear surface S110b may be referred to as a backside surface (or a non-active side) BS of the semiconductor die 100. For example, in direction Z, the frontside surface FS of the semiconductor die 100 is opposite to the backside surface BS (S110b) of the semiconductor die 100.

In some embodiments, the exposed portion of the conductive vias 150 is located on the frontside surface FS of the semiconductor die 100, and the electrically conductive structure 200A is located on the backside surface BS (S110b) of the semiconductor die 100. The insulating encapsulation 500 encapsulates sidewalls of the semiconductor die 100 and sidewalls of the conductive pillars 400, and the insulating encapsulation 500 is penetrated by the conductive pillars 400. In some embodiments, after the planarizing process, a cleaning step may be optionally performed to clean and remove the residue generated from the planarizing process. In the embodiments of which the electrically conductive structure 200A is free from the dielectric layer 312c, the sidewall SW200A is completely covered by the insulating encapsulation 500. In the embodiments of which the electrically conductive structure 200A is partially exposed from the dielectric layer 312c, the sidewall SW200A is partially covered by the insulating encapsulation 500. In the embodiments of which the electrically conductive structure 200A is completely covered by the dielectric layer 312c, the sidewall SW200A is free from the insulating encapsulation 500.

Figure 8:
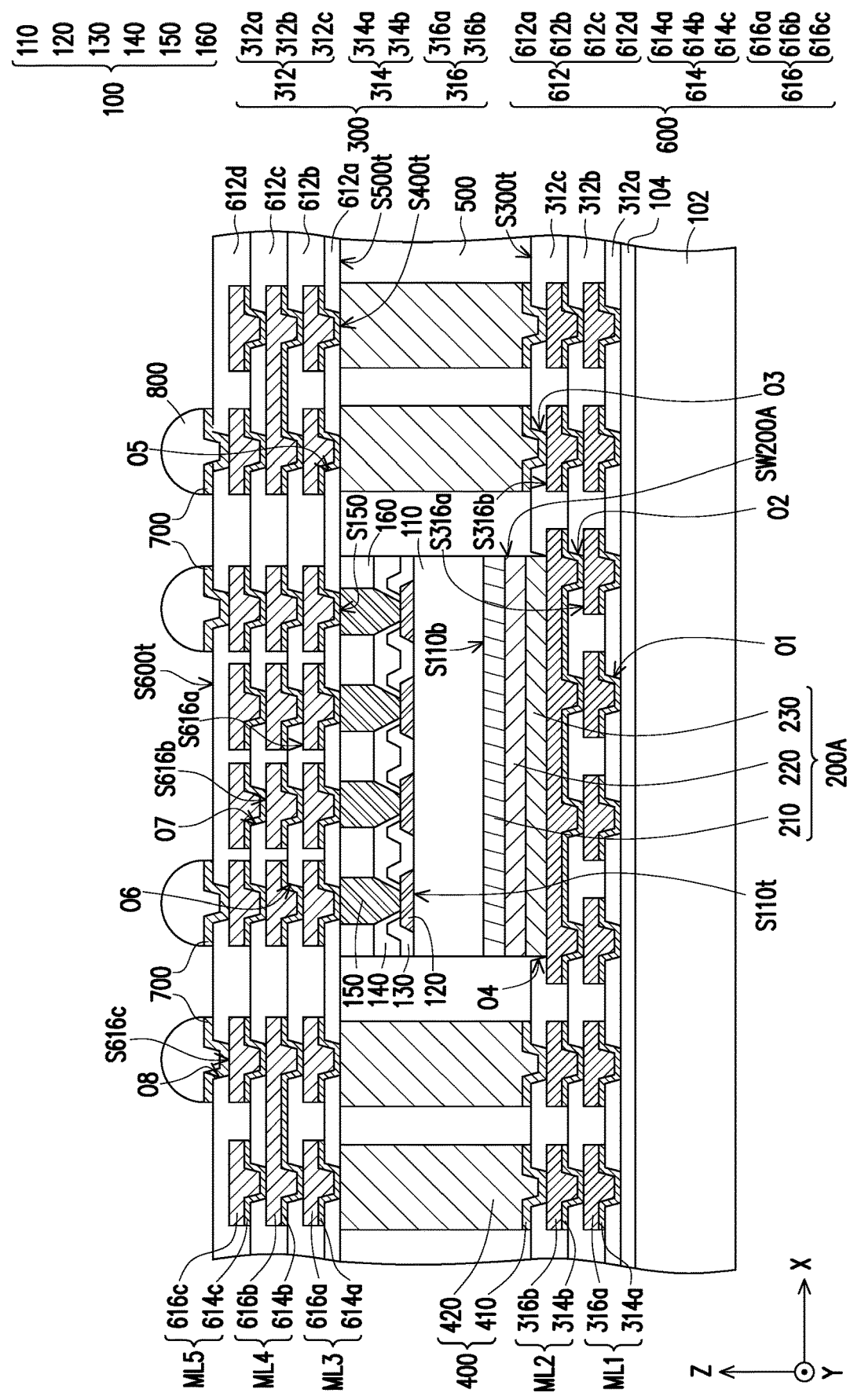

Referring to FIG. 8, in some embodiments, a redistribution circuit structure 600 is formed on the insulating encapsulation 500, the semiconductor die 100, and the conductive pillars 400. In some embodiments, the redistribution circuit structure 600 includes at least one dielectric layer 612 (e.g., 612a, 612b, 612c, and 612d), at least one seed layer 614 (e.g., 614a, 614b, and 614c), and at least one patterned conductive layer 616 (e.g., 616a, 616b, and 616c). However, in the disclosure, the numbers of layers of the dielectric layer 612, the seed layer 614, and the patterned conductive layer 166 are not limited to what is depicted in FIG. 8, where the number of each of the layers of the dielectric layer 612, the seed layer 614, and the patterned conductive layer 166 may be one or more than one depending upon the demand and design requirements. In some embodiments, one patterned conductive layer 166 includes a line portion extending along a horizontal direction (e.g., the direction X or the direction Y), a via portion extending along a vertical direction (e.g., the direction Z), or a combination thereof. The seed layer 614a and the patterned conductive layer 616a may be collectively referred to as a metallization layer ML3, the seed layer 614b and the patterned conductive layer 616b may be collectively referred to as a metallization layer ML4, and the seed layer 614c and the patterned conductive layer 616c may be collectively referred to as a metallization layer ML5.

In some embodiments, a dielectric layer 612a, a seed layer 614a, a patterned conductive layer 616a are sequentially formed over the insulating encapsulation 150 to form a first build-up layer of the redistribution circuit structure 600, a dielectric layer 612b, a seed layer 614b, a patterned conductive layer 616b are sequentially formed over the first build-up layer to form a second build-up layer of the redistribution circuit structure 600, a dielectric layer 612c, a seed layer 614c, a patterned conductive layer 616c are sequentially formed over the second build-up layer to form a third build-up layer of the redistribution circuit structure 600, and a dielectric layer 612d is formed on the third build-up layer as being a passivation layer of the redistribution circuit structure 600. As shown in FIG. 8, a plurality of openings O5 are formed in the dielectric layer 612a to expose the surface S150 of the conductive vias 150 and the surface S400t of the conductive pillars 400, so to electrically coupling the patterned conductive layer 616a to the conductive vias 150 and the conductive pillars 400 exposed by the dielectric layer 612a through the seed layer 614a, a plurality of openings O6 are formed in the dielectric layer 612b to expose the surface S616a of the patterned conductive layer 616a, so to electrically coupling the patterned conductive layer 616b to the patterned conductive layer 616a exposed by the dielectric layer 612b through the seed layer 614b, and a plurality of openings O7 are formed in the dielectric layer 612c to expose the surface S616b of the patterned conductive layer 616b, so to electrically coupling the patterned conductive layer 616c to the patterned conductive layer 616b exposed by the dielectric layer 612c through the seed layer 614c. In the case, a plurality of openings O8 are formed in the dielectric layer 612d to expose the surface S616c of the patterned conductive layer 616c, so to electrically connecting the patterned conductive layer 616c to a later-formed element or component.

Depending on the demand and design layout/requirements, the number of the build-up layers of the redistribution circuit structure 600 can be one, two, three, or more than three, as long as the redistribution circuit structure 600 can provide enough routing function to the semiconductor die 100. The formation, material, and configuration of each of the dielectric layers 612a-612d, the seed layers 614a-614c, and the patterned conductive layers 616a-616c of the redistribution circuit structure 600 are similar to or substantially identical to the formation, material, and configuration of each of the dielectric layers 312a-312c, the seed layers 34a-314b, and the patterned conductive layers 316a-316b of the redistribution circuit structure 300, respectively; and thus are not repeated herein for brevity.

In some embodiments, in each of the metallization layers ML3, ML4, and ML5, sidewalls of the seed layer 614 are substantially aligned with sidewalls of the patterned conductive layer 616, for example. In other words, in each metallization layer ML3, ML4, or ML5, the seed layer 614 and the patterned conductive layer 616 share the same contour, in a vertical projection on the carrier 102 along the direction Z. In some embodiments, the metallization layers ML3, ML4, and ML5 are physically connected and physically connected to each other. The metallization layers ML3, ML4, and ML5 may be referred to as redistribution (or routing) layers, redistribution (or routing) lines, or redistribution (or routing) wires of the redistribution circuit structure 600, and the dielectric layers 612 (including 612a-612d) collectively may be referred to as a dielectric structure of the redistribution circuit structure 600. The redistribution circuit structure 600 may be referred to as a frontside redistribution circuit structure or frontside redistribution structure of the semiconductor die 100, in the semiconductor package 10. In some embodiments, the redistribution circuit structure 600 is disposed on (e.g., in physically contact with) the semiconductor die 100, the conductive pillars 400, and the insulating encapsulation 500, where the redistribution circuit structure 600 are electrically connected to the semiconductor die 100 and the conductive pillars 400. In the case, the conductive pillars 400 are electrically coupled to the semiconductor die 100 through the redistribution circuit structure 600, and the redistribution circuit structure 300 is electrically coupled to the semiconductor die 100 through the conductive pillars 400 and the redistribution circuit structure 600.

Continued on FIG. 8, in some embodiments, a plurality of under-ball metallurgy (UBM) patterns 700 and a plurality of conductive terminals 800 are sequentially formed over the redistribution circuit structure 600. In some embodiments, the UBM patterns 700 each are located between a respective one of the conductive terminals 800 and the dielectric layer 612d of the redistribution circuit structure 600. For example, the UBM patterns 700 are disposed on the dielectric layer 612d and further extend into the openings O8 formed in the dielectric layer 612d to be in (physical) contact with the patterned conductive layer 616c exposed therefrom so to be electrically connected to the patterned conductive layer 616c, and the conductive terminals 800 are disposed on (e.g., in physical contact with) and electrically connected to the UBM patterns 700. Due to the UBM patterns 700, the adhesion strength between the conductive terminals 800 and the dielectric layer 612d of the redistribution circuit structure 600 is enhanced. In some embodiments, the UBM patterns 700 are physically connected to and electrically connected to the redistribution circuit structure 600. In some embodiments, the conductive terminals 800 are electrically coupled to the redistribution circuit structure 600 through the UBM patterns 700. In some embodiments, some of the conductive terminals 800 are electrically coupled to the semiconductor die 100 through some of the UBM patterns 700 and the redistribution circuit structure 600. In some embodiments, some of the conductive terminals 800 are electrically coupled to the conductive pillars 400 through some of the UBM patterns 700 and the redistribution circuit structure 600. In some embodiments, some of the conductive terminals 800 are electrically coupled to the redistribution circuit structure 300 through some of the UBM patterns 700, the redistribution circuit structure 600, and the conductive pillars 400.

In some embodiments, the UBM patterns 700 are made of a metal layer including a single layer or a metallization layer including a composite layer with a plurality of sub-layers formed of different materials. In some embodiments, the UBM patterns 700 include copper, nickel, molybdenum, titanium, tungsten, titanium nitride, titanium tungsten, combinations thereof, or the like. The UBM patterns 700 may include a titanium layer and a copper layer over the titanium layer. The UBM patterns 700 may be formed using electroplating, sputtering, PVD, or the like. For example, the UBM patterns 700 are conformally formed on the dielectric layer 612d by sputtering to extend on an outermost surface of the dielectric layer 612d and further extend into the openings O8 formed in the dielectric layer 612d, and thus are in physical contact with the surface S616c of the patterned conductive layer 616c exposed by the openings O8 formed in the dielectric layer 612d. The UBM patterns 700 are electrically isolated from one another. The number of the UBM patterns 700 may not be limited in this disclosure, and may correspond to the number of the portions of the patterned conductive layer 616c exposed by the openings O8 formed in the dielectric layers 612d.

In some embodiments, the conductive terminals 800 are physically connected to and electrically connected to the UBM patterns 700, and are electrically coupled to the redistribution circuit structure 600 through the UBM patterns 700. In some embodiments, the conductive terminals 800 are disposed on the UBM patterns 700 by ball placement process or reflow process. For example, the conductive terminals 800 includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The number of the conductive terminals 800 is not limited to the drawings of the embodiments, and may be selected and designated based on the demand and design requirements. The number of the conductive terminals 800 may be controlled by adjusting the number of the UBM patterns 700. When solder is used, the solder may include either eutectic solder or non-eutectic solder. The solder may include lead or be lead-free, and may include Sn—Ag, Sn—Cu, Sn—Ag—Cu, or the like. The conductive terminals 800 may be solder free. The conductive terminals 800 may be referred to as conductors, conductive connectors, or conductive input/output terminals of the semiconductor package 10 for electrical connection with external components or elements (e.g., an additional semiconductor package/device, a circuit substrate, an interposer, an capacitor, a power source, or the like, etc.).

However, the disclosure is not limited thereto. In some alternative embodiments, the UBM patterns 700 may be omitted. In such alternative embodiments, the conductive terminals 800 may be directly connected to (e.g., in physical contact with) the redistribution circuit structure 600 (e.g., the portions of the conductive layer 616c exposed by the openings O8). In further alternative embodiments, the conductive terminals 800 may be omitted, as well.

Figure 9:
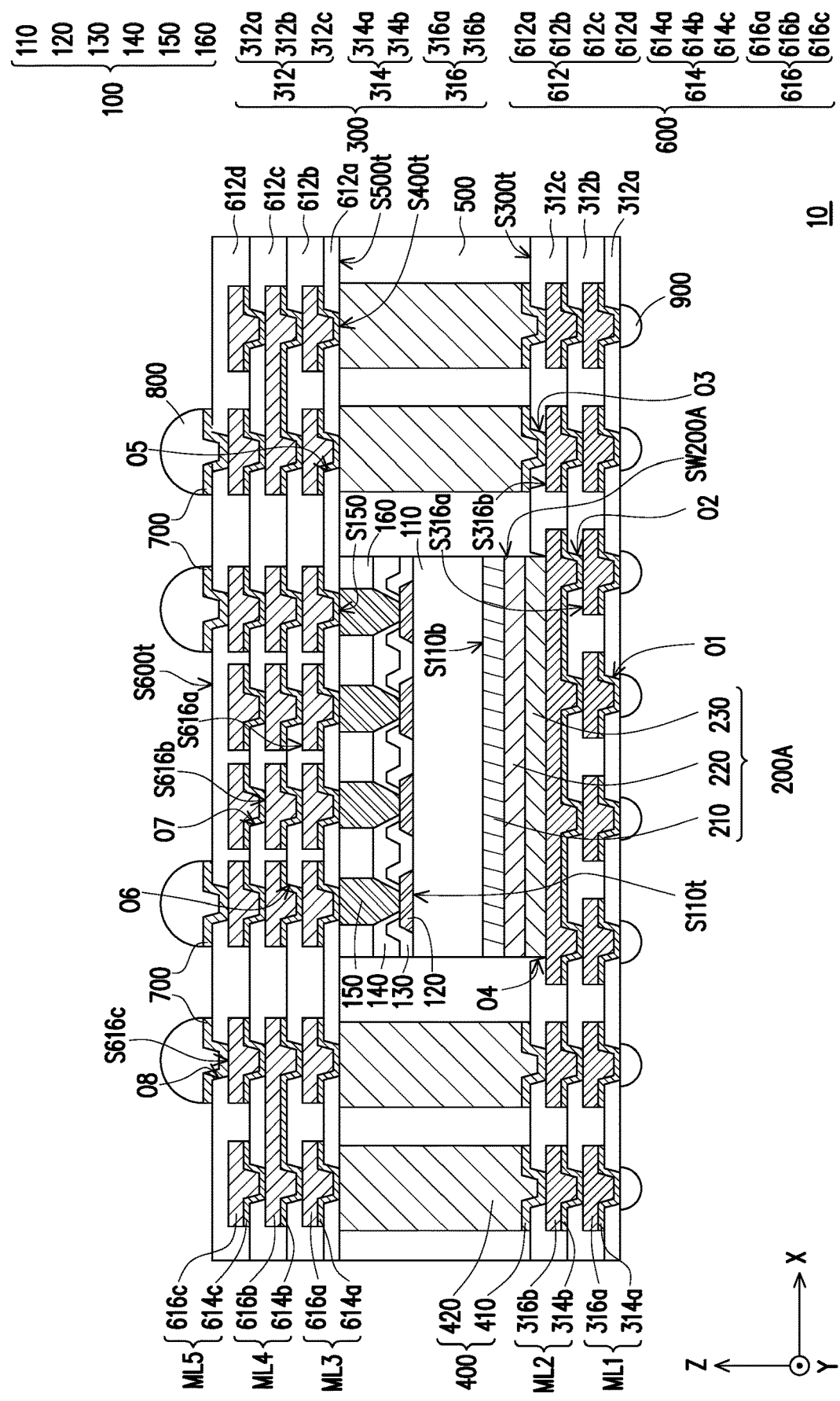

Referring to FIG. 9, in some embodiments, the carrier 102 is debonded from the redistribution circuit structure 300. For example, the redistribution circuit structure 300 is easily separated from the carrier 102 due to the release layer 104.

In some embodiments, the carrier 102 is detached from the redistribution circuit structure 300 through a debonding process, where the carrier 102 and the release layer 104 are debonded and then removed. In some embodiments, a surface of the redistribution circuit structure 300 is exposed. In this case, the seed layer 314a is accessibly exposed. In one embodiment, the debonding process is a laser debonding process. During the debonding step, an additional holding device (not shown) is used to secure the structure depicted in FIG. 8 by holding the conductive terminals 800 in a proper place, before debonding the carrier 102 and the release layer 104. The additional holding device is similar to or substantially identical to the holding device HD as described in FIG. 2, and thus are not repeated herein.

In some embodiments, a plurality of conductive terminals 900 are formed on the exposed surface of the redistribution circuit structure 300. For example, the seed layer 314a accessibly revealed is covered by (e.g., in physical contact with) the conductive terminals 900. The conductive terminals 900 may include conductive bumps or conductive balls. For example, the conductive terminals 900 includes micro-bumps, metal pillars, ENEPIG formed bumps, C4 bumps (for example, which may have, but not limited to, a size of about 80 μm), a BGA bumps or balls (for example, which may have, but not limited to, a size of about 400 μm), solder balls, or the like. The disclosure is not limited thereto. Alternatively, the conductive terminals 900 may be pre-solder pastes or be pre-solder blocks. The number of the conductive terminals 900 is not limited to the drawings of the embodiments, and may be selected and designated based on the demand and design requirements. When solder is used, the solder may include either eutectic solder or non-eutectic solder. The solder may include lead or be lead-free, and may include Sn—Ag, Sn—Cu, Sn—Ag—Cu, or the like. The conductive terminals 900 may be solder free. The conductive terminals 900 may be referred to as conductors, conductive connectors, or conductive input/output terminals of the semiconductor package 10 for electrical connection with external components or elements (e.g., an additional semiconductor package/device, a circuit substrate, an interposer, an capacitor, a power source, or the like, etc.). In some embodiments, the conductive terminals 900 are electrically connected to the redistribution circuit structure 300. For example, some of the conductive terminals 900 are electrically coupled to the conductive pillars 400 through the redistribution circuit structure 300. For example, some of the conductive terminals 900 are electrically coupled to the redistribution circuit structure 600 through the redistribution circuit structure 300 and the conductive pillars 400. For example, some of the conductive terminals 900 are electrically coupled to the semiconductor die 100 through the redistribution circuit structure 300, the conductive pillars 400 and the redistribution circuit structure 600. In alternative embodiments, the conductive terminals 900 can be omitted. Or alternatively, additional UBM patterns (not shown) may be formed between the seed layer 314a and the conductive terminals 900, where the formation and material of the additional UBM patterns are similar to or substantially identical to the formation and material of the UBM patterns 700, and thus are not repeated herein for brevity.

In some embodiments, the conductive terminals 800 are released from the additional holding device to form the semiconductor package 10. In some embodiments, a dicing (singulating) process is performed to cut a plurality of the semiconductor packages 10 interconnected therebetween into individual and separated semiconductor packages 10 before releasing the conductive terminals 800 from the additional holding device. In one embodiment, the dicing process is a wafer dicing process including mechanical blade sawing or laser cutting. Up to here, the semiconductor package 10 is manufactured. The semiconductor package 10 depicted in FIG. 9 may be referred to as an integrated fan-out (semiconductor) semiconductor package having dual-side terminals.

In some embodiments, after dicing, a sidewall of the redistribution circuit structure 300, a sidewall of the insulating encapsulation 500, and a sidewall of the redistribution circuit structure 600 are substantially aligned to each other, in the semiconductor package 10. That is, the sidewall of the redistribution circuit structure 300, the sidewall of the insulating encapsulation 500, and the sidewall of the redistribution circuit structure 600 together constitute a sidewall of the semiconductor package 10. In FIG. 9, for example, a thickness of the insulating encapsulation 500 is less than a thickness of the conductive pillars 400 and a sum of a thickness of the semiconductor die 100 and a thickness of the electrically conductive structure 200A. On the other hand, the sum of the thickness of the semiconductor die 100 and the thickness of the electrically conductive structure 200A is substantially equal to the thickness of the conductive pillars 400. In some embodiments, the semiconductor package 10 may be further mounted with a circuit substrate, an interposer, an additional package, chips/dies or other electronic devices to form a stacked semiconductor package, with or without through the conductive terminals 800 and/or conductive terminals 900 based on the design layout and the demand.

Alternatively, the semiconductor package 10 may be formed by a different forming process. For one non-limiting example, the processes described in FIG. 2 through FIG. 4 may be replaced with processes of FIG. 10 through FIG. 12A. FIG. 10 through FIG. 12A are schematic cross-sectional views of various stages in part of a manufacturing method of the semiconductor package 10 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 10:
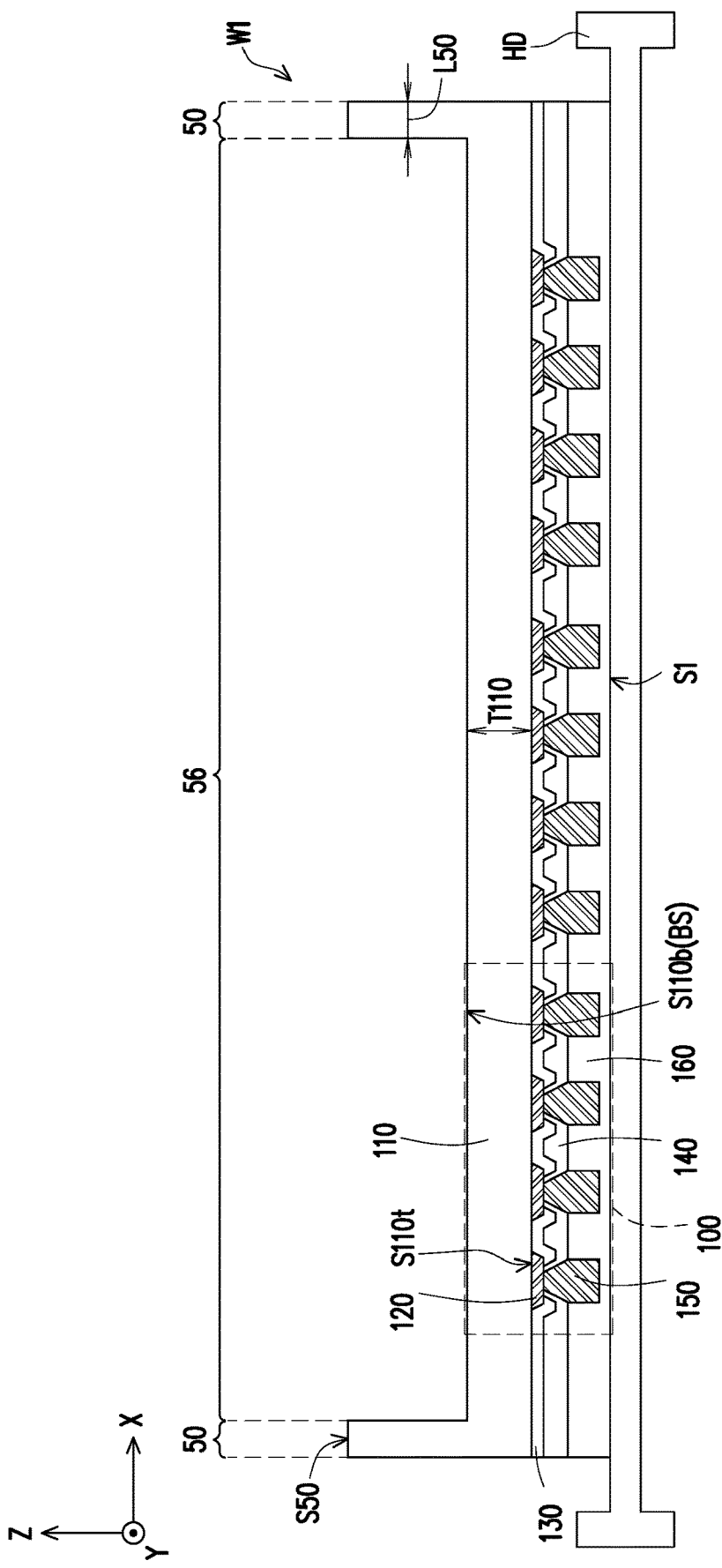

Referring to FIG. 10, in some embodiments, the wafer W1 is flipped (turned upside down) and placed onto a holding device HD, and the semiconductor substrate 110 is partially thinned down from the rear surface S110b by a planarization process, following the process as described in FIG. 1. The details of each of the wafer W1 (including a plurality of semiconductor dies 100 each having the semiconductor substrate 110, the pads 120, the passivation layer 130, the post-passivation layer 140, the conductive vias 150, and the protection layer 160) and holding device HD are previously described in FIG. 1 and FIG. 2, and thus are not repeated herein for brevity. In some embodiments, a thinned thickness T110 of the semiconductor substrate 110 may approximately range from 20 μm to 720 μm. As shown in FIG. 10, the wafer W1 may include a device region 54 and a peripherical region 52 surrounding the device region 54, where only a portion of the semiconductor substrate 110 within the device region 54 may be thinned down to the thickness T110, and a portion of the semiconductor substrate 110 within the peripherical region 52 may remain the same. For example, a surface S50 of the portion of the semiconductor substrate 110 within the peripherical region 52 is above a surface (e.g., the rear surface S110b) of the thinned portion of the semiconductor device 110 within the device region 54. In some embodiments, a lateral size L50 of the portion of the semiconductor substrate 110 within the peripherical region 52 is approximately in a range of 1 μm to 100 μm. The planarizing process may be performed by Taiko grinding. After the planarizing process, a cleaning step may be optionally performed, for example to clean and remove the residue generated from the planarizing process.

Figure 11:
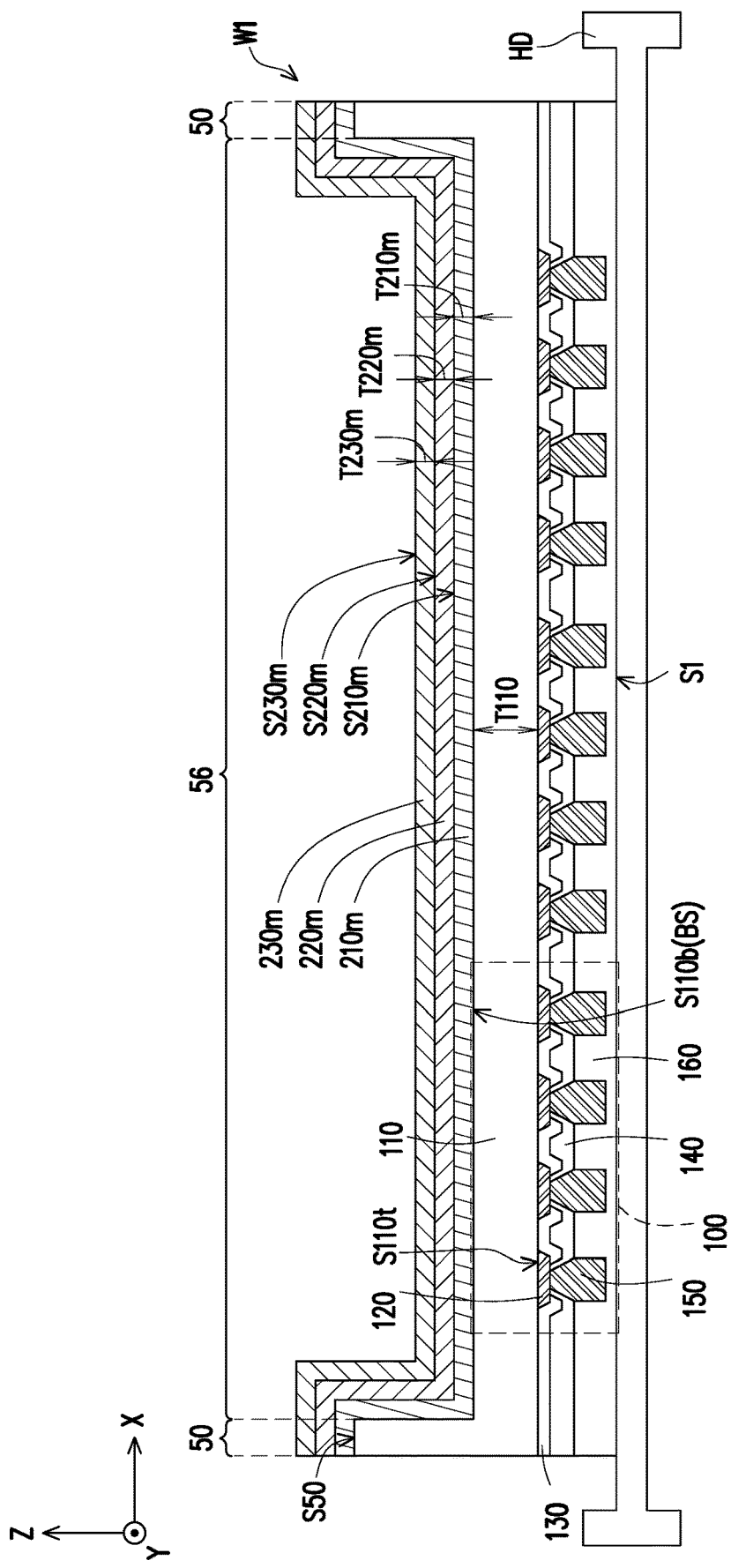

Referring to FIG. 11, in some embodiments, a conductive material 210m, a conductive material 220m, and a conductive material 230m are sequentially and conformally formed over the illustrated top surface (e.g., including the surface S50 and the surface S110b) of the wafer W1. The formation, material, and configuration of each of the conductive material 210m and the conductive material 220m have been previously described in FIG. 3 and FIG. 4, the formation, material, and configuration of the conductive material 230m is similar to or substantially identical to the formation, material, and configuration of the first conductive material as described in FIG. 4, and thus are not repeated herein for brevity. The conductive material 210m may have a thickness T210m of about 0.01 μm to about 10 μm as measured along the direction Z, although other suitable thickness may alternatively be utilized. The conductive material 220m may have a thickness T220m of about 0.01 μm to about 50 μm as measured along the direction Z, although other suitable thickness may alternatively be utilized. The conductive layer 230 may have a thickness T230 of about 0.01 μm to about 100 μm as measured along the direction Z, although other suitable thickness may alternatively be utilized.

Figure 12A:
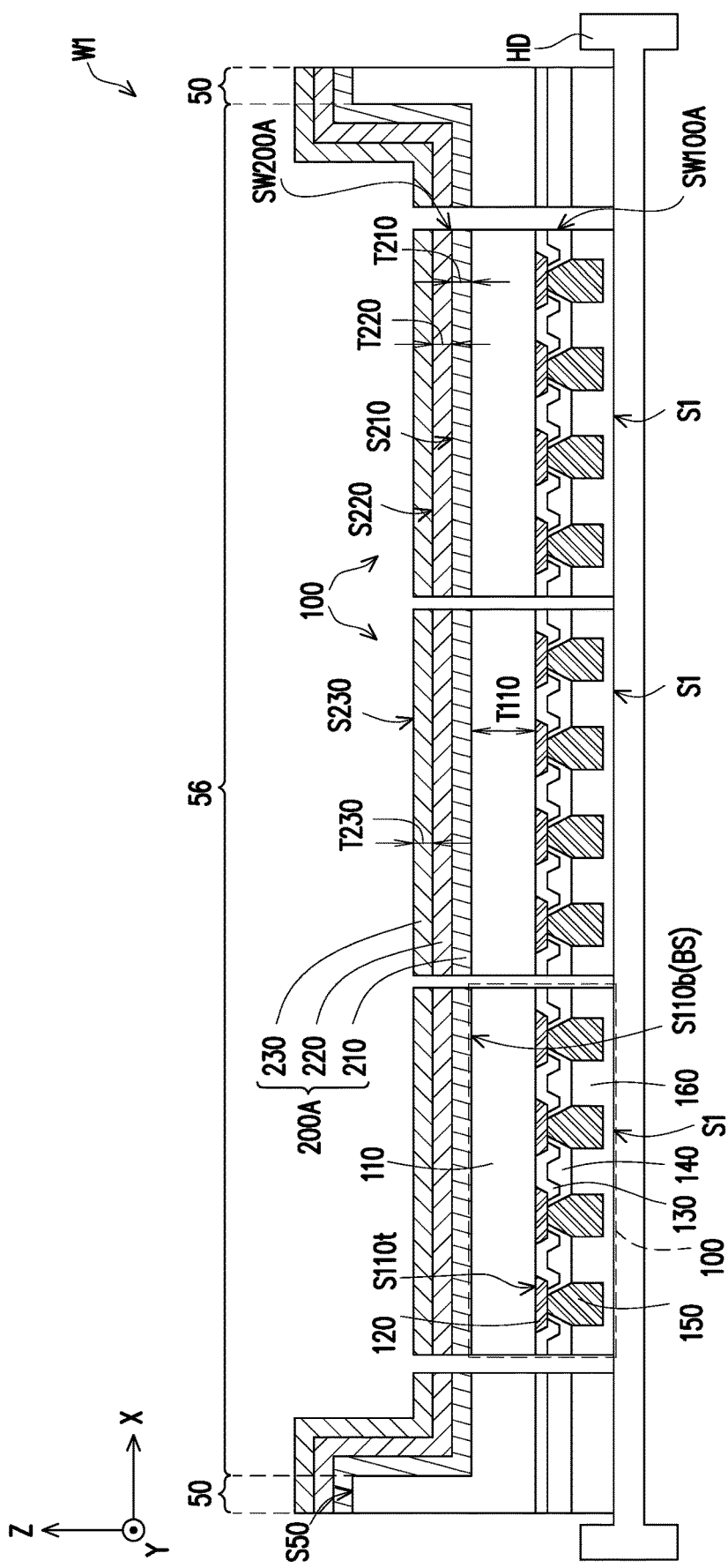

Referring to FIG. 12A, in some embodiments, a dicing (or singulation) process is sequentially performed to form individual and separated semiconductor dies 100, where each of the semiconductor dies 100 is disposed with an electrically conductive structure (also referred to as an electrically conductive adhesive structure) 200A at the rear surface S110b thereof. In one embodiment, the singulation process is a wafer dicing process including mechanical blade sawing or laser cutting. The disclosure is not limited thereto. As shown in FIG. 12A, for each semiconductor die 100, a sidewall SW200A of the electrically conductive structure 200A is substantially aligned with a sidewall SW100 of the semiconductor die 100, in the direction Z. In some embodiments, the material of the conductive layer 210 is different from the material of the conductive layer 220 and the material of the conductive layer 230, and the material of the conductive layer 220 is different from the material of the conductive layer 230. For a non-limiting example, the conductive layer 210 is made of Ti, the conductive layer 220 is made of Cu, and the conductive layer 230 is made of Sn. Then, the previously described manufacturing processes as described in in FIG. 5 through FIG. 9 above can be performed to obtain the semiconductor package 10 depicted in FIG. 9.

FIG. 12B through FIG. 16 are schematic cross-sectional views of various stages in a manufacturing method of a semiconductor package 20 in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 12B:
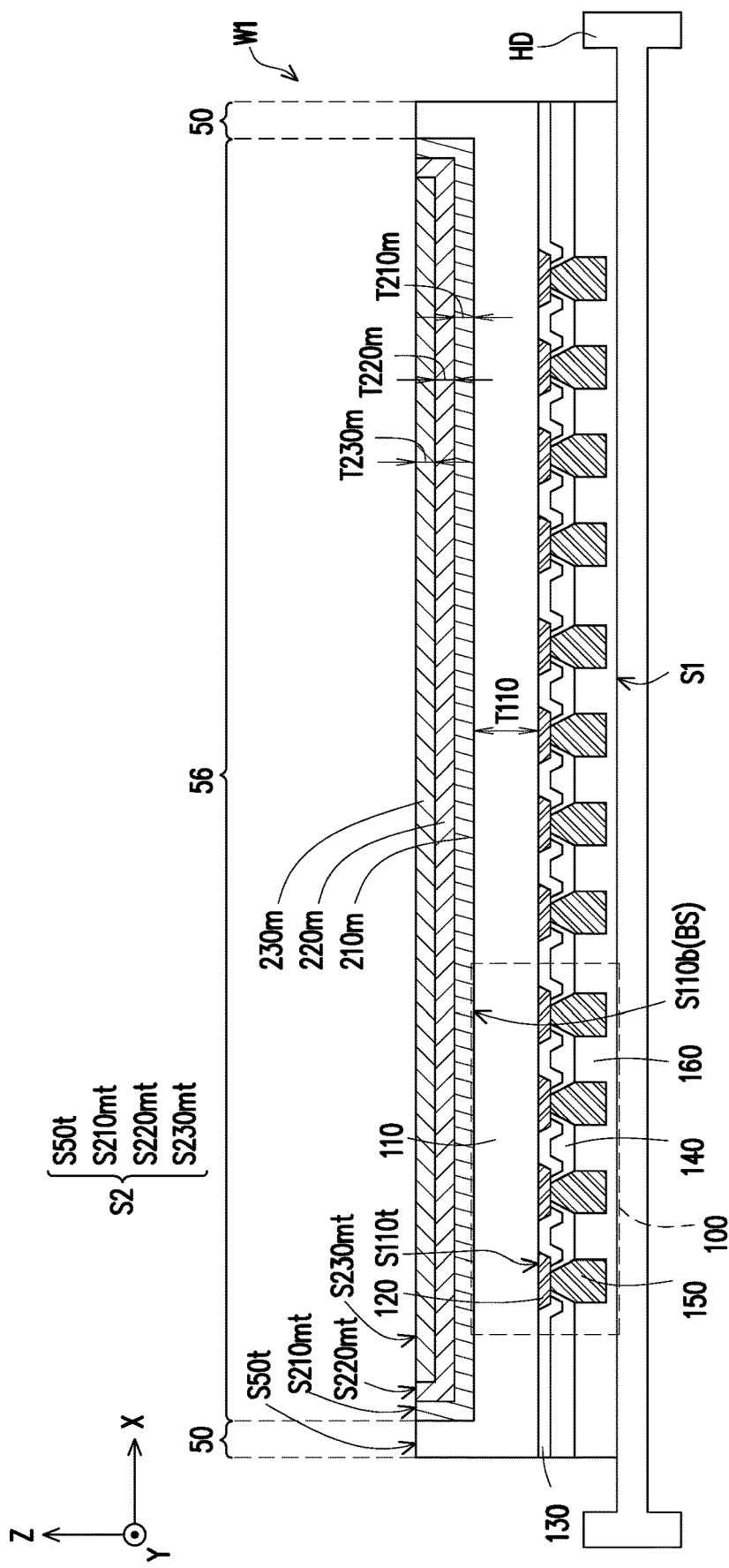

Referring to FIG. 12B, in some embodiments, a planarizing process is performed on the wafer W1 being placed on the holding device HD, following the process as described in FIG. 11. The details of each of the wafer W1 (including a plurality of semiconductor dies 100 each having the semiconductor substrate 110, the pads 120, the passivation layer 130, the post-passivation layer 140, the conductive vias 150, and the protection layer 160) and holding device HD are previously described in FIG. 1 and FIG. 2, and thus are not repeated herein for brevity. For example, a planarized surface S50t of the portion of the semiconductor substrate 110 within the peripherical region 50, a planarized surface S210mt of the conductive material 210m, a planarized surface S220mt of the conductive material 220m, and a planarized surface S230mt of the conductive material 230m are substantially leveled with each other. In the case, the planarized surface S50t of the portion of the semiconductor substrate 110 within the peripherical region 50, the planarized surface S210mt of the conductive material 210m, the planarized surface S220mt of the conductive material 220m, and the planarized surface S230mt of the conductive material 230m are substantially coplanar to each other. For example, after planarizing, the planarized surface S50t of the portion of the semiconductor substrate 110 within the peripherical region 50, the planarized surface S210mt of the conductive material 210m, the planarized surface S220mt of the conductive material 220m, and the planarized surface S230mt of the conductive material 230m together constitute a planar surface S2 of the wafer W1, where the planar surface 2 provides a high degree of coplanarity and flatness. Due to the high degree of coplanarity and flatness, the formation of the later-formed layer(s) and/or element(s) is beneficial.

In some embodiments, the planarizing process may include a grinding process, a CMP process, an etching process, or combinations thereof. The etching process may include a dry etching, a wet etching, or a combination thereof. However, the disclosure is not limited thereto, and the planarizing process may be performed through any other suitable method. After the planarizing process, a cleaning step may be optionally performed, for example to clean and remove the residue generated from the planarizing process.

Figure 13:
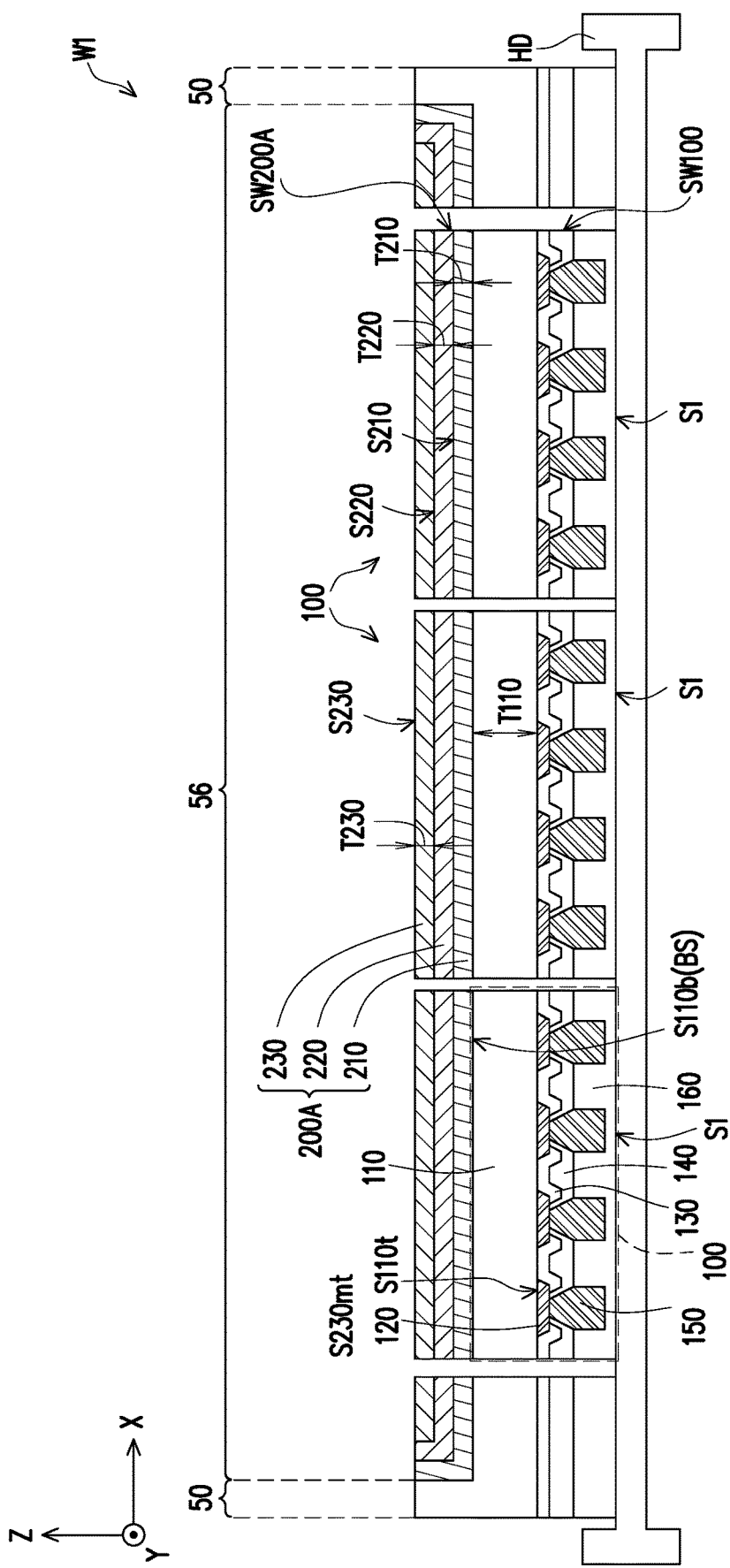

Referring to FIG. 13, in some embodiments, a dicing (or singulation) process is sequentially performed to form individual and separated semiconductor dies 100, where each of the semiconductor dies 100 is disposed with an electrically conductive structure (also referred to as an electrically conductive adhesive structure) 200A at the rear surface S110b thereof. The details of the electrically conductive structure 200A are previously described in FIG. 3 and FIG. 4, and thus are not repeated herein for brevity. Owing to the planarizing process described in FIG. 12B, an outermost surface of the electrically conductive structure 200A depicted in FIG. 13 has a higher degree of coplanarity and flatness than an outermost surface of the electrically conductive structure 200A depicted in FIG. 4. In one embodiment, the singulation process is a wafer dicing process including mechanical blade sawing or laser cutting; however, the disclosure is not limited thereto. As shown in FIG. 13, for each semiconductor die 100, a sidewall SW200A of the electrically conductive structure 200A is substantially aligned with a sidewall SW100 of the semiconductor die 100, in the direction Z.

Figure 14:
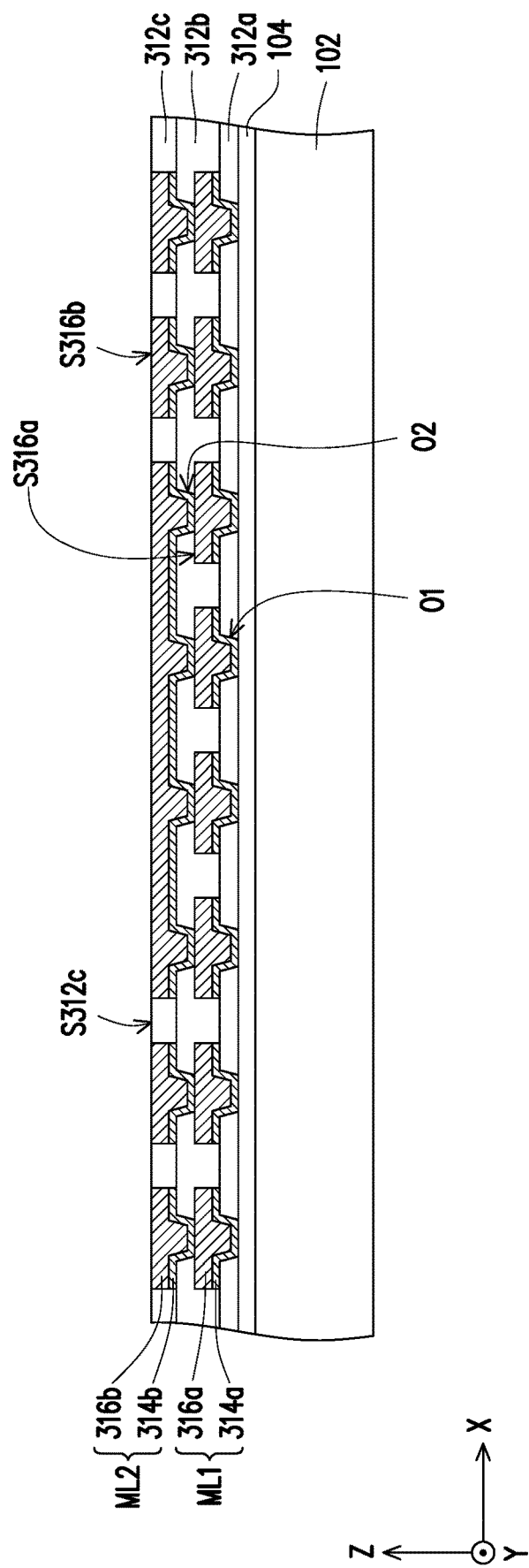

Referring to FIG. 14, in some embodiments, a carrier 102 coated with a release layer 104 is provided; then, a dielectric layer 312a, a seed layer 314a, a patterned conductive layer 316a, a dielectric layer 312b, a seed layer 314b, a patterned conductive layer 316b, and a dielectric layer 312c are sequentially formed on the release layer 104 and over the carrier 102. The seed layer 314a and the patterned conductive layer 316a may be collectively referred to as a metallization layer ML1, and the seed layer 314b and the patterned conductive layer 316b may be collectively referred to as a metallization layer ML2. For example, the metallization layer ML1 are electrically coupled to the metallization layer Ml2. The details, formation, and material of each of the carrier 102, the release layer 104, the dielectric layers 312a-312c, the seed layers 314a-314b, the patterned conductive layers 316a-316b, and the metallization layers ML1-ML2 have been previously described in FIG. 5, and thus are not repeated herein for brevity. After forming the dielectric layer 312c, another planarizing process is performed on the dielectric layer 312c to obtain a surface S312c being substantially coplanar to (e.g., leveled with) a surface S316b of the patterned conductive layer 316b; thereby providing high degree of coplanarity and flatness. Due to the high degree of coplanarity and flatness, the formation of the later-formed layer(s) and/or element(s) is beneficial. In some embodiments, the another planarizing process may include a grinding process, a CMP process, an etching process, or combinations thereof. The etching process may include a dry etching, a wet etching, or a combination thereof. However, the disclosure is not limited thereto, and the another planarizing process may be performed through any other suitable method. After the another planarizing process, a cleaning step may be optionally performed, for example to clean and remove the residue generated from the another planarizing process.

Figure 15:
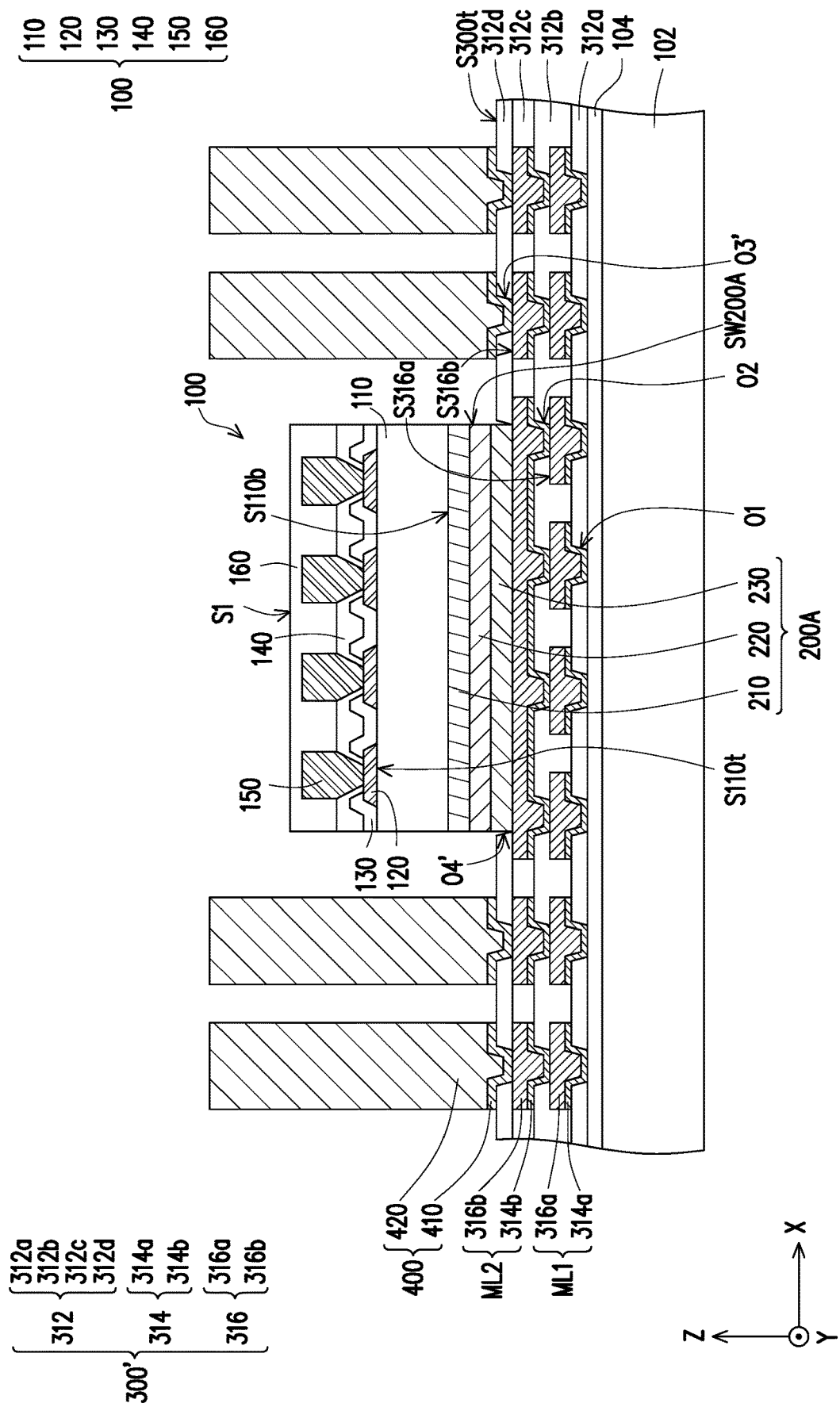

Referring to FIG. 15, in some embodiments, a dielectric layer 312d is formed on the dielectric layer 312c and the patterned conductive layer 316b exposed therefrom. For example, the dielectric layer 312d includes a plurality of openings O3' and at least one opening O4' for at least partially exposing the patterned conductive layer 316b exposed from the dielectric layer 312c. Up to here, a redistribution circuit structure 300' is manufactured, where the redistribution circuit structure 300' includes at least one dielectric layer 312 (including 312a, 312b, 312c, and 312d), at least one seed layer 314 (including 314a and 314b), and at least one patterned conductive layer 316 (including 316a and 316b), in some embodiments. However, in the disclosure, the numbers of the dielectric layers 312, the seed layers 314 and the patterned conductive layers 316 are not limited to the drawing of FIG. 15, where the number of each of the dielectric layers 312, the seed layers 314 and the patterned conductive layers 316 may be one, two, three or more than three, as long as the redistribution circuit structure 300' can provide a sufficient routing function to the semiconductor die 100. The dielectric layer 312d may be referred to as a passivation layer of the redistribution circuit structure 300'. The formation and material of the dielectric layer 312d may be similar to or substantially identical to the formation and material of the dielectric layer 312a, 312b, and/or 312c as described in FIG. 5, and thus are not repeated herein. The dielectric layers 312a, 312b, 312c and 312d may be collectively referred to as a dielectric structure of the redistribution circuit structure 300'. The dielectric layer 312a, the seed layer 314a, and the patterned conductive layer 316a may be referred to as a first build-up layer of the redistribution circuit structure 300', and the dielectric layer 312b, the seed layer 314b, and the patterned conductive layer 316b may be referred to as a second build-up layer of the redistribution circuit structure 300'. The number of the build-up layers included in the redistribution circuit structure 300' may be one, two, three or more based on the demand and design layout/requirements, and is not limited in the disclosure. Owing to the planarizing process described in FIG. 14, the patterned conductive layer 316b exposed by the dielectric layers 312c and 312d depicted in FIG. 15 has a higher degree of coplanarity and flatness than the patterned conductive layer 316b exposed by the dielectric layer 312c depicted in FIG. 5, which can further facilitate the sequential processes such as the placement of the semiconductor die 100 (with the electrically conductive structure 200A) and conductive pillars 400.

Continued on FIG. 15, in some embodiments, a plurality of conductive pillars 400 are formed on the redistribution circuit structure 300', and at least one of the semiconductor dies 100 (depicted in FIG. 13) is disposed on the redistribution circuit structure 300' and next to the conductive pillars 400. The details, formation, and material of the conductive pillars 400 have previously described in FIG. 5, and thus are not repeated herein. The conductive pillars 400 are electrically connected to the redistribution circuit structure 300' through the openings O3'. In some embodiments, the semiconductor die 100 is bonded to the redistribution circuit structure 300' by adhering onto the patterned conductive layer 316b of the redistribution circuit structure 300' exposed by the opening O4' formed in the dielectric layer 312d with the electrically conductive structure 200A. The semiconductor die 100 (e.g., the rear surface S110b of the semiconductor substrate 110) may be directly adhered to the surface S316b of the patterned conductive layer 316b by the electrically conductive structure 200A. For example, as shown in FIG. 15, the electrically conductive structure 200A is disposed in the opening O4' formed in the dielectric layer 312d and sandwiched between the semiconductor die 100 and the redistribution circuit structure 300'. Owing to the electrically conductive structure 200A, the semiconductor die 100 is stably adhered to and thermally coupled to the redistribution circuit structure 300'.

In some embodiments, after placing the semiconductor die 100 onto the redistribution circuit structure 300' so as to physical contact the conductive layer 230 of the electrically conductive structure 200A with the patterned conductive layer 316b exposed by the opening O4' formed in the dielectric layer 312d, a bonding process is performed to form an eutectic bond between metal atoms included in the conductive layer 230 of the electrically conductive structure 200A and metal atoms included in the patterned conductive layer 316b of the redistribution circuit structure 300', thereby stably adhering the semiconductor die 100 to the redistribution circuit structure 300' through the electrically conductive structure 200A. For a non-limiting example, if considering the conductive layer 230 is made of Sn and the patterned conductive layer 316b is made of Cu, there is an eutectic bond of Sn and Cu at an interface of the conductive layer 230 and the patterned conductive layer 316b, where the bonding process includes a reflow process. With the electrically conductive structure 200A, a heat dissipating path from the semiconductor substrate 110 of the semiconductor die 100 to the metallization layers ML1, ML2 of the redistribution circuit structure 300' is established, thereby obtaining a better efficiency for heat dissipating to the semiconductor die 100 included in the semiconductor package 20. In some embodiments, the sidewall SW200A of the electrically conductive structure 200A is free from the dielectric layer 312d of the redistribution circuit structure 300', as shown in FIG. 15. However, the disclosure is not limited thereto; alternatively, the sidewall SW200A of the electrically conductive structure 200A may be partially covered by the dielectric layer 312d of the redistribution circuit structure 300'. Or, the sidewall SW200A of the electrically conductive structure 200A may be completely covered by the dielectric layer 312d of the redistribution circuit structure 300'.

In some embodiments, the semiconductor die 100 and the conductive pillars 400 are arranged next to each other along the X-Y plane. In other words, the semiconductor die 100 do not overlap with the conductive pillars 400 in the direction Z, but are overlapped with each other in the direction X and/or the direction Y. In one embodiment, a height of the conductive pillars 400 is greater than a height of the semiconductor die 100, as shown in FIG. 15. Alternatively, the height of the conductive pillars 400 may be less than or substantially equal to the height of the semiconductor die 100. Only one semiconductor die 100 is shown in FIG. 15 for illustrative purposes and simplicity, however the number of the semiconductor die 100 is not limited thereto, and should be selected and/or designated, depending on the demand and design layout/requirements.

Figure 16:
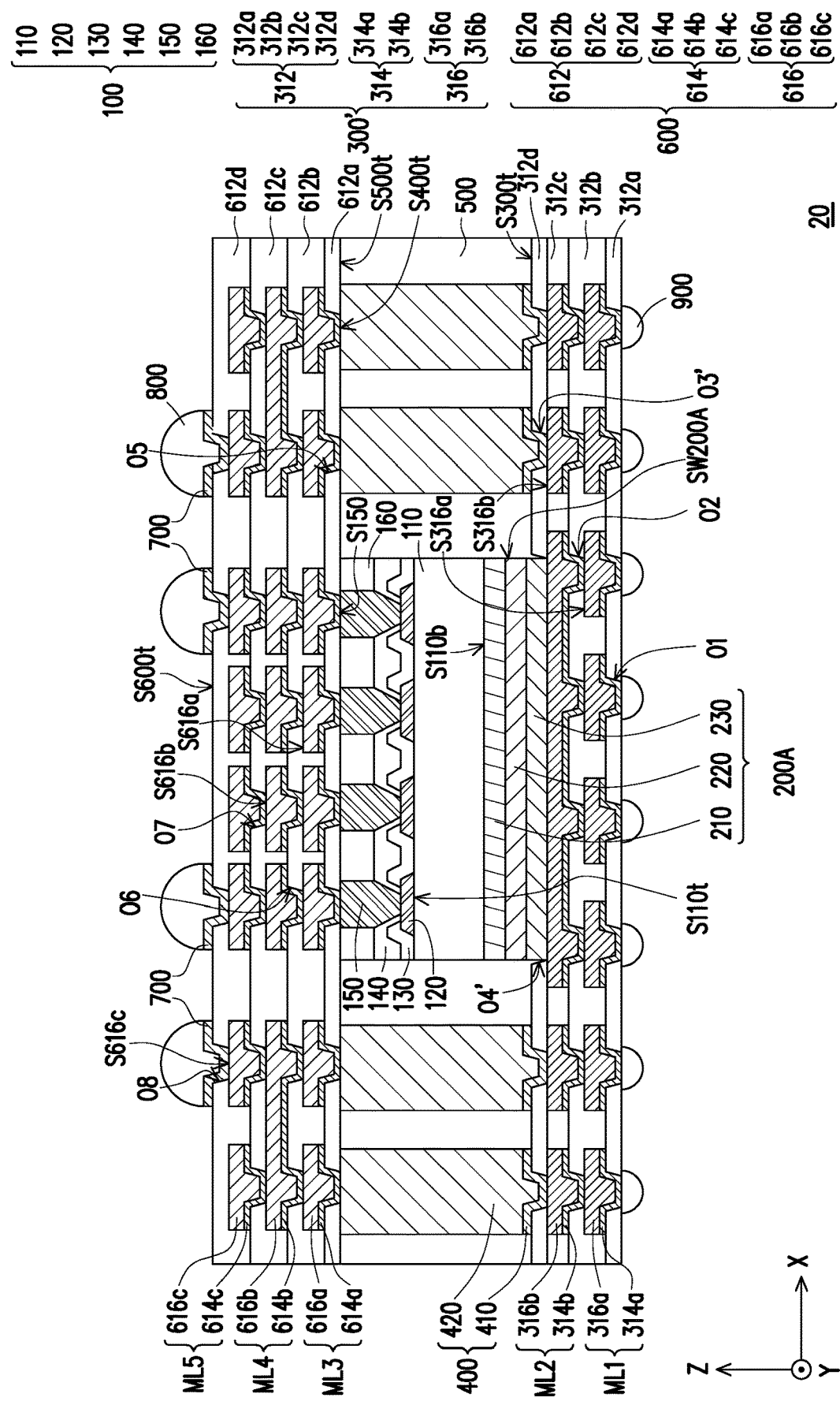

Referring to FIG. 16, in some embodiments, the processes previously described in FIG. 6 through FIG. 9 are sequentially performed on the structure depicted in FIG. 15 to form a semiconductor package 20. The semiconductor package 10 depicted in FIG. 9 may be referred to as an integrated fan-out (semiconductor) semiconductor package having dual-side terminals. In some embodiments, the semiconductor package 20 includes the semiconductor die 100, the electrically conductive structure 200A, the redistribution circuit structure 300', the conductive pillars 400, the insulating encapsulation 500, the redistribution circuit structure 600, the UBM patterns 700, the conductive terminals 800, and the conductive terminals 900. The details of the insulating encapsulation 500, the redistribution circuit structure 600, the UBM patterns 700, the conductive terminals 800, and the conductive terminals 900 are previous described in FIG. 6 through FIG. 9, and thus are not repeated herein for brevity. The semiconductor die 100 and the conductive pillars 400 are disposed on the redistribution circuit structure 300', where the electrically conductive structure 200A is interposed between the semiconductor die 100 and the redistribution circuit structure 300', for example. In some embodiments, the insulating encapsulation 500 laterally encapsulates the semiconductor die 100, the electrically conductive structure 200A and the conductive pillars 400 and covers the redistribution circuit structure 300' exposed by the semiconductor die 100, the electrically conductive structure 200A and the conductive pillars 400. For example, as shown in FIG. 16, the redistribution circuit structure 600 is disposed on the insulating encapsulation 500 and electrically connected to the semiconductor die 100 and the conductive pillars 400.

In some embodiments, the UBM patterns 700 are disposed on (e.g., in physical contact with) and electrically connected to the redistribution circuit structure 600, and the conductive terminals 800 are respectively disposed on (e.g., in physical contact with) the UBM patterns 700 and electrically connected to the UBM patterns 700. In the case, the conductive terminals 800 are electrically coupled to the redistribution circuit structure 600 through the UBM patterns 700. In some embodiments, some of the conductive terminals 800 are electrically coupled to the semiconductor die 100 through some of the UBM patterns 700 and the redistribution circuit structure 600. In some embodiments, some of the conductive terminals 800 are electrically coupled to the conductive pillars 400 through some of the UBM patterns 700 and the redistribution circuit structure 600. In some embodiments, some of the conductive terminals 800 are electrically coupled to the redistribution circuit structure 300' through some of the UBM patterns 700, the redistribution circuit structure 600, and the conductive pillars 400. In one embodiment, the UBM patterns 700 may be omitted. Alternatively, the conductive terminals 800 may be omitted. Or alternatively, both of the UBM patterns 700 and the conductive terminals 800 may be omitted.

In some embodiments, the conductive terminals 900 are disposed on (e.g., in physical contact with) and electrically connected to the redistribution circuit structure 300'. In some embodiments, some of the conductive terminals 900 are electrically coupled to the conductive pillars 400 through the redistribution circuit structure 300'. In some embodiments, some of the conductive terminals 900 are electrically coupled to the redistribution circuit structure 600 through the redistribution circuit structure 300' and the conductive pillars 400. In some embodiments, some of the conductive terminals 900 are electrically coupled to the semiconductor die 100 through the redistribution circuit structure 300', the conductive pillars 400, and the redistribution circuit structure 600. In one embodiment, additional UBM patterns (e.g., similar to the UBM patterns 700) may be presented between the conductive terminals 900 and the redistribution circuit structure 300'. Alternatively, the conductive terminals 900 may be omitted.

In some embodiments, a sidewall of the redistribution circuit structure 300', a sidewall of the insulating encapsulation 500, and a sidewall of the redistribution circuit structure 600 are substantially aligned to each other, in the semiconductor package 20. That is, the sidewall of the redistribution circuit structure 300', the sidewall of the insulating encapsulation 500, and the sidewall of the redistribution circuit structure 600 together constitute a sidewall of the semiconductor package 20. In FIG. 16, for example, a thickness of the insulating encapsulation 500 is less than a thickness of the conductive pillars 400 and a sum of a thickness of the semiconductor die 100 and a thickness of the electrically conductive structure 200A. On the other hand, the sum of the thickness of the semiconductor die 100 and the thickness of the electrically conductive structure 200A is substantially equal to the thickness of the conductive pillars 400. In some embodiments, the semiconductor package 20 may be further mounted with a circuit substrate, an interposer, an additional package, chips/dies or other electronic devices to form a stacked semiconductor package, with or without through the conductive terminals 800 and/or conductive terminals 900 based on the design layout and the demand.

In the above embodiments, the electrically conductive structure 200A includes a structure of three-layer. However, the disclosure is not limited thereto; alternatively, an electrically conductive structure (also referred to as an electrically conductive adhesive structure) in the disclosure may include a structure of two-layer.

Figure 17:
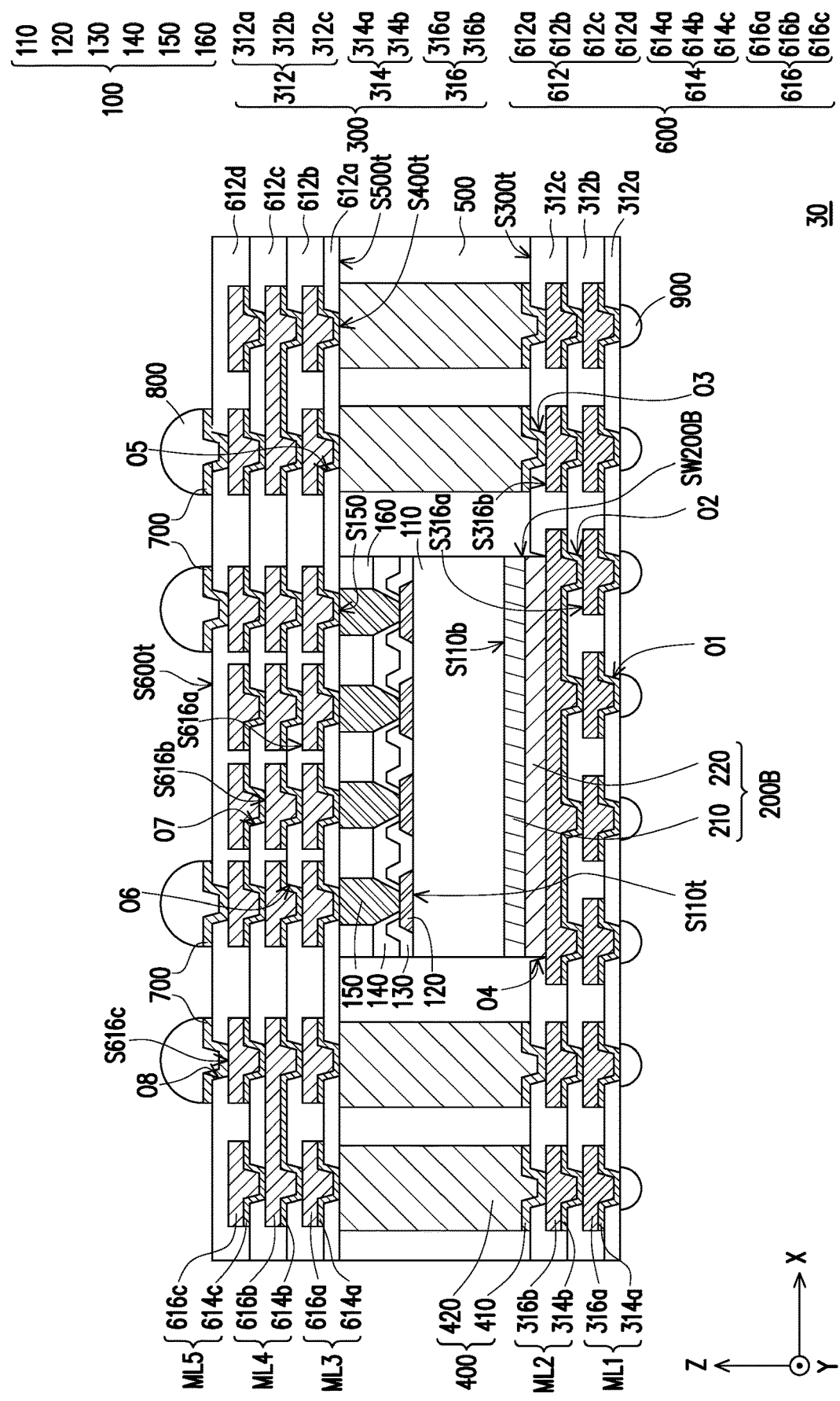
FIG. 17 is a schematic cross-sectional view of a semiconductor package in accordance with some embodiments of the disclosure.

FIG. 17 is a schematic cross-sectional view of a semiconductor package 30 in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 9 and FIG. 17 together, the semiconductor package 10 depicted in FIG. 9 and the semiconductor package 30 depicted in FIG. 17 are similar; the difference is that, the semiconductor package 30 includes an electrically conductive structure (also referred to as an electrically conductive adhesive structure) 200B substituting the electrically conductive structure 200A.

In some embodiments, the semiconductor package 30 includes the semiconductor die 100, the electrically conductive structure 200B, the redistribution circuit structure 300, the conductive pillars 400, the insulating encapsulation 500, the redistribution circuit structure 600, the UBM patterns 700, the conductive terminals 800, and the conductive terminals 900. The details, formation, and material of the semiconductor die 100, the redistribution circuit structure 300, the conductive pillars 400, he insulating encapsulation 500, the redistribution circuit structure 600, the UBM patterns 700, the conductive terminals 800, and the conductive terminals 900 are previous described in FIG. 1 through FIG. 2 and FIG. 5 through FIG. 9, and thus are not repeated herein for brevity. In some embodiments, the electrically conductive structure 200B include a structure of two-layer, which includes a conductive layer 210 and a conductive layer 220. In some embodiments, the material of the conductive layer 210 is different from the material of the conductive layer 220. For a non-limiting example, the conductive layer 210 is made of Ti, and the conductive layer 220 is made of Cu. That is, the electrically conductive structure 200B includes a structure of multi-layer with different materials, in some embodiments. The conductive layer 210 and the conductive layer 220 are electrically connected and thermally connected to each other, in each electrically conductive structure 200B. For a non-limiting example, if considering the conductive layer 220 is made of Cu, a thermal conductivity of the electrically conductive structure 200B is greater than or substantially equal to 390 W/(m·k). The details, formation, and material of a conductive layer 210 and the conductive layer 220 are previous described in FIG. 3 through FIG. 4 or FIG. 10 through FIG. 12A, and thus are not repeated herein for brevity. The conductive layer 210 may be referred to as a conductive adhesive layer or a metallization adhesive layer of the electrically conductive structure 200B. The conductive layer 220 may be referred to as a first conductive heat dissipator, a first metallization layer or a first metallization heat dissipator of the electrically conductive structure 200B.

The semiconductor die 100 and the conductive pillars 400 are disposed on the redistribution circuit structure 300, where the electrically conductive structure 200B is interposed between the semiconductor die 100 and the redistribution circuit structure 300, for example. A sidewall SW200B of the electrically conductive structure 200B is substantially aligned with a sidewall SW100 of the semiconductor die 100, as shown in FIG. 17, for example. In some embodiments, the semiconductor die 100 (e.g., the rear surface S110b of the semiconductor substrate 110) is adhered to the surface S316b of the patterned conductive layer 316b directly by the electrically conductive structure 200B. For example, as shown in FIG. 17, the electrically conductive structure 200B is disposed in the opening O4 formed in the dielectric layer 312c and sandwiched between the semiconductor die 100 and the redistribution circuit structure 300. Owing to the electrically conductive structure 200B, the semiconductor die 100 is stably adhered to and thermally coupled to the redistribution circuit structure 300. In some embodiments, after placing the semiconductor die 100 onto the redistribution circuit structure 300 so as to physical contact the conductive layer 220 of the electrically conductive structure 200B with the patterned conductive layer 316b exposed by the opening O4 formed in the dielectric layer 312c, a bonding process is performed to form an eutectic bond between metal atoms included in the conductive layer 220 of the electrically conductive structure 200B and metal atoms included in the patterned conductive layer 316b of the redistribution circuit structure 300, thereby stably adhering the semiconductor die 100 to the redistribution circuit structure 300 through the electrically conductive structure 200B. For a non-limiting example, if considering the conductive layer 220 is made of Cu and the patterned conductive layer 316b is made of Cu, there is an eutectic bond of Cu and Cu at an interface of the conductive layer 220 and the patterned conductive layer 316b, where the bonding process includes a heating and pressing process. With the electrically conductive structure 200B, a heat dissipating path from the semiconductor substrate 110 of the semiconductor die 100 to the metallization layers ML1, ML2 of the redistribution circuit structure 300 is established, thereby obtaining a better efficiency for heat dissipating to the semiconductor die 100 included in the semiconductor package 30. Besides, an overall thickness of the semiconductor package 30 is further reduced. In some embodiments, the sidewall SW200B of the electrically conductive structure 200B is free from the dielectric layer 312c of the redistribution circuit structure 300, as shown in FIG. 17. However, the disclosure is not limited thereto; alternatively, the sidewall SW200B of the electrically conductive structure 200B may be partially covered by the dielectric layer 312c of the redistribution circuit structure 300. Or, the sidewall SW200B of the electrically conductive structure 200B may be completely covered by the dielectric layer 312c of the redistribution circuit structure 300.

In some embodiments, the insulating encapsulation 500 laterally encapsulates the semiconductor die 100, the electrically conductive structure 200B and the conductive pillars 400, and covers the redistribution circuit structure 300 exposed by the semiconductor die 100, the electrically conductive structure 200B and the conductive pillars 400. For example, as shown in FIG. 17, the redistribution circuit structure 600 is disposed on the insulating encapsulation 500 and electrically connected to the semiconductor die 100 and the conductive pillars 400. In some embodiments, the UBM patterns 700 are disposed on (e.g., in physical contact with) and electrically connected to the redistribution circuit structure 600, and the conductive terminals 800 are respectively disposed on (e.g., in physical contact with) the UBM patterns 700 and electrically connected to the UBM patterns 700. In the case, the conductive terminals 800 are electrically coupled to the redistribution circuit structure 600 through the UBM patterns 700. In some embodiments, some of the conductive terminals 800 are electrically coupled to the semiconductor die 100 through some of the UBM patterns 700 and the redistribution circuit structure 600. In some embodiments, some of the conductive terminals 800 are electrically coupled to the conductive pillars 400 through some of the UBM patterns 700 and the redistribution circuit structure 600. In some embodiments, some of the conductive terminals 800 are electrically coupled to the redistribution circuit structure 300 through some of the UBM patterns 700, the redistribution circuit structure 600, and the conductive pillars 400. In one embodiment, the UBM patterns 700 may be omitted. Alternatively, the conductive terminals 800 may be omitted. Or alternatively, both of the UBM patterns 700 and the conductive terminals 800 may be omitted.

In some embodiments, the conductive terminals 900 are disposed on (e.g., in physical contact with) and electrically connected to the redistribution circuit structure 300, as shown in FIG. 17. In some embodiments, some of the conductive terminals 900 are electrically coupled to the conductive pillars 400 through the redistribution circuit structure 300. In some embodiments, some of the conductive terminals 900 are electrically coupled to the redistribution circuit structure 600 through the redistribution circuit structure 300 and the conductive pillars 400. In some embodiments, some of the conductive terminals 900 are electrically coupled to the semiconductor die 100 through the redistribution circuit structure 300, the conductive pillars 400, and the redistribution circuit structure 600. In one embodiment, additional UBM patterns (e.g., similar to the UBM patterns 700) may be presented between the conductive terminals 900 and the redistribution circuit structure 300. Alternatively, the conductive terminals 900 may be omitted.

In some embodiments, a sidewall of the redistribution circuit structure 300, a sidewall of the insulating encapsulation 500, and a sidewall of the redistribution circuit structure 600 are substantially aligned to each other, in the semiconductor package 30. That is, the sidewall of the redistribution circuit structure 300, the sidewall of the insulating encapsulation 500, and the sidewall of the redistribution circuit structure 600 together constitute a sidewall of the semiconductor package 30. In FIG. 17, for example, a thickness of the insulating encapsulation 500 is less than a thickness of the conductive pillars 400 and a sum of a thickness of the semiconductor die 100 and a thickness of the electrically conductive structure 200B. On the other hand, the sum of the thickness of the semiconductor die 100 and the thickness of the electrically conductive structure 200B is substantially equal to the thickness of the conductive pillars 400. In some embodiments, the semiconductor package 30 may be further mounted with a circuit substrate, an interposer, an additional package, chips/dies or other electronic devices to form a stacked semiconductor package, with or without through the conductive terminals 800 and/or conductive terminals 900 based on the design layout and the demand.

Figure 18:
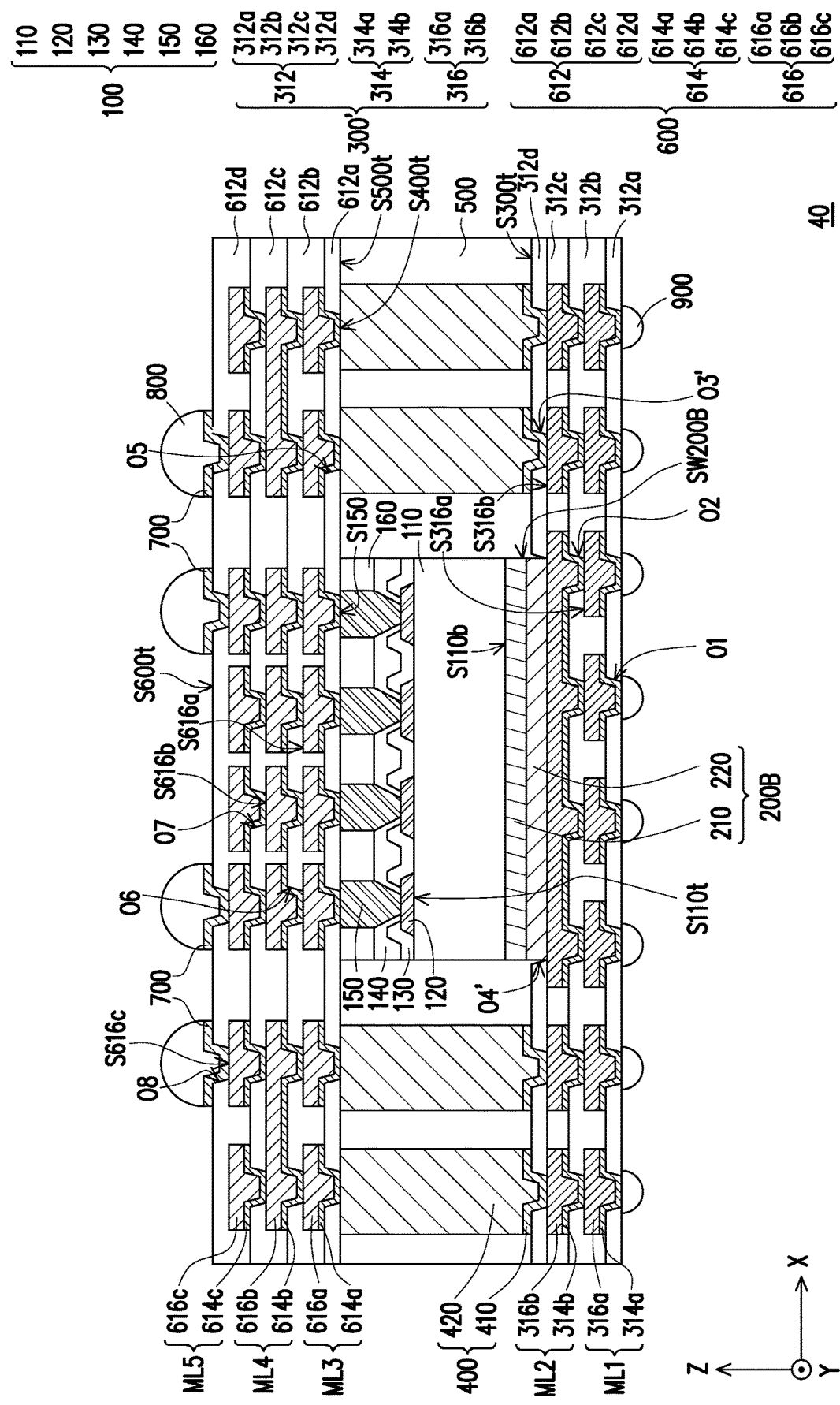
FIG. 18 is a schematic cross-sectional view of a semiconductor package in accordance with some embodiments of the disclosure.

FIG. 18 is a schematic cross-sectional view of a semiconductor package 40 in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 17 and FIG. 18 together, the semiconductor package 30 depicted in FIG. 17 and the semiconductor package 40 depicted in FIG. 18 are similar; the difference is that, the semiconductor package 40 includes a redistribution circuit structure 300' substituting the redistribution circuit structure 300. The details of the redistribution circuit structure 300' have previously described in FIG. 14 through FIG. 15, and thus are not repeated herein. With the redistribution circuit structure 300', the patterned conductive layer 316b exposed by the dielectric layers 312c and 312d depicted in FIG. 18 has a higher degree of coplanarity and flatness than the patterned conductive layer 316b exposed by the dielectric layer 312c depicted in FIG. 17, which can further facilitate the sequential processes such as the placement of the semiconductor die 100 (with the electrically conductive structure 200B) and conductive pillars 400.

Figure 19:
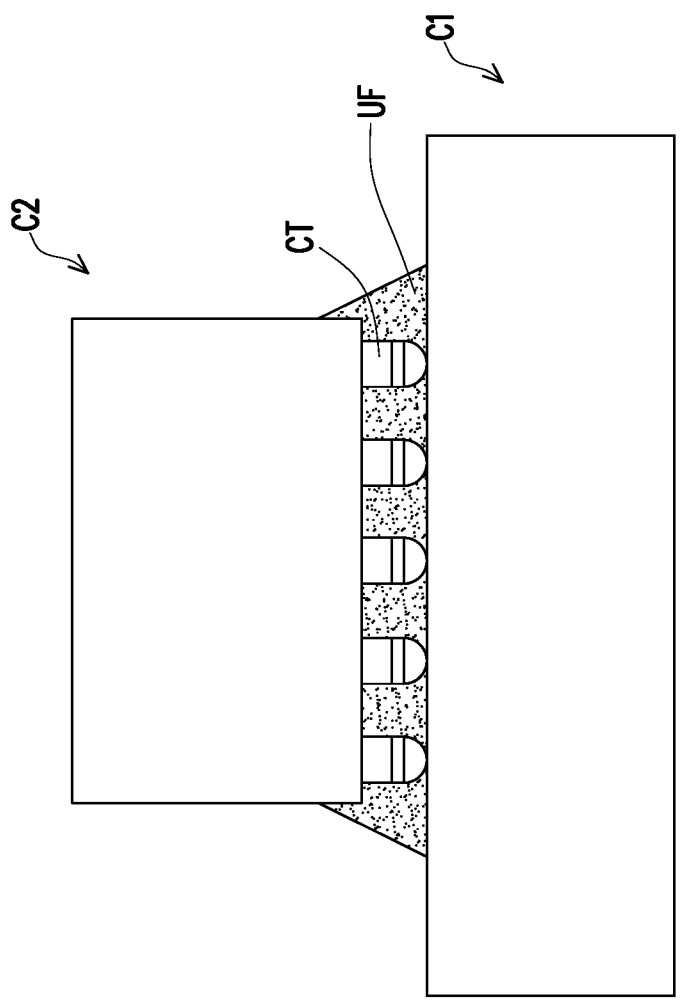
FIG. 19 is a schematic cross-sectional view showing an application of a semiconductor package in accordance with some embodiments of the disclosure.

In some embodiments, the package structures 10, 20, 30, 40, and/or modifications thereof may be further mounted onto a package substrate, and the package substrate may be a printed circuit board, an interposer (e.g., a silicon interposer including through silicon vias) and so on. FIG. 19 is a schematic cross-sectional view showing an application of a semiconductor package in accordance with some embodiments of the disclosure. The elements similar to or substantially the same as the elements described previously will use the same reference numbers, and certain details or descriptions (e.g., the materials, formation processes, positioning configurations, electrical connections, etc.) of the same elements would not be repeated herein. Referring to FIG. 19, in some embodiments, a component assembly SC including a first component C1 and a second component C2 disposed over the first component C1 is provided. The first component C1 may be or may include a circuit structure, such as a mother board, a package substrate, another printed circuit board (PCB), a printed wiring board, an interposer, and/or other carrier that is capable of carrying integrated circuits. In some embodiments, the second component C2 mounted on the first component C1 is similar to one of the semiconductor packages 10, 20, 30, 40, and/or modifications thereof. For example, one or more second components C2 (e.g., 10, 20, 30, 40, and/or modifications thereof) may be electrically coupled to the first component C1 through a plurality of terminals CT. The terminals CT may be the conductive terminals 800 or 900. In some embodiments, an underfill UF is formed between the gap of the first component C1 and the second component C2 to at least laterally cover the terminals CT. Alternatively, the underfill UF is omitted. The underfill UF may be any acceptable material, such as a polymer, epoxy resin, molding underfill, or the like, for example. In one embodiment, the underfill UF may be formed by underfill dispensing, a capillary flow process, or any other suitable method. Owing to the underfill UF, a bonding strength between the first component C1 and the second component C2 is enhanced.

The disclosure is not limited thereto. In some embodiments, the semiconductor packages 10, 20, 30, 40, and/or modifications thereof may be individually packaged or integrated in different package types or modules, such as an integrated Fan-Out (InFO) package, an InFO package having a Package-on-Package (POP) structure, a chip-on-wafer-on-substrate (CoWoS) package, a flip chip package of an InFO package, or the like. The disclosure is not limited thereto.

In accordance with some embodiments, a semiconductor package includes a first redistribution circuit structure, a semiconductor die, and an electrically conductive structure. The semiconductor die is disposed over and electrically coupled to the first redistribution circuit structure. The electrically conductive structure connects a non-active side of the semiconductor die to a conductive feature of the first redistribution circuit structure, where the semiconductor die is thermally couped to the first redistribution circuit structure through the electrically conductive structure, and the electrically conductive structure includes a structure of multi-layer with different materials.

In accordance with some embodiments, a semiconductor package includes a backside redistribution circuit structure, a semiconductor die, an insulating encapsulation, and an electrically conductive structure. The backside redistribution circuit structure includes a first dielectric layer and a conductive layer at least laterally covered by first dielectric layer, where portions of the conductive layer are exposed by the first dielectric layer. The semiconductor die is disposed over a first portion of the portions of the conductive layer included in the backside redistribution circuit structure exposed by the first dielectric layer. The insulating encapsulation laterally encapsulates the semiconductor die. The electrically conductive structure connects a non-active side of the semiconductor die to the first portion, where the semiconductor die is thermally couped to the backside redistribution circuit structure through the electrically conductive structure, and the electrically conductive structure is protruding out of an outermost surface of the backside redistribution circuit structure in a cross-section of the semiconductor package.

In accordance with some embodiments, a method of manufacturing a semiconductor package includes the following steps: providing a semiconductor die disposed with an electrically conductive structure at a non-active side of the semiconductor die, wherein the electrically conductive structure includes a structure of multi-layer with different materials; forming a first redistribution circuit structure; and disposing the semiconductor die over the first redistribution circuit structure through the electrically conductive structure, the semiconductor die being electrically coupled to the first redistribution circuit structure, and the electrically conductive structure connecting the non-active side of the semiconductor die to a conductive feature of the first redistribution circuit structure, wherein the semiconductor die is thermally couped to the first redistribution circuit structure through the electrically conductive structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages as the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
   a first redistribution circuit structure;
   a semiconductor die, disposed over and electrically coupled to the first redistribution circuit structure; and
   an electrically conductive structure, connecting a non-active side of the semiconductor die to a conductive feature of the first redistribution circuit structure exposed by a recess confined in the first redistribution circuit structure, wherein the semiconductor die is thermally coupled to the first redistribution circuit structure through the electrically conductive structure, wherein the electrically conductive structure includes a structure of multi-layer with different materials,
   wherein the recess has a bottom and a sidewall, the sidewall surrounding and joined to the bottom, the bottom being within the first redistribution circuit structure,
   wherein in a cross-section of the semiconductor package, the conductive feature of the first redistribution circuit structure continuously extends onto and contacts the electrically conductive structure disposed on the bottom of the recess.

2. The semiconductor package of claim 1, wherein the electrically conductive structure comprises a first conductive layer and a second conductive layer, and the first conductive layer is interposed between the non-active side of the semiconductor die and the second conductive layer.

3. The semiconductor package of claim 2, wherein a material of the first conductive layer comprises Ti or Ta, and is different from a material of the second conductive layer.

4. The semiconductor package of claim 2, wherein the electrically conductive structure further comprises a third conductive layer, and the second conductive layer is interposed between the first conductive layer and the third conductive layer.

5. The semiconductor package of claim 4, wherein a material of the first conductive layer comprises Ti or Ta, and is different from a material of the second conductive layer and a material of the third conductive layer,
   wherein the material of the second conductive layer is different from the material of the third conductive layer.

6. The semiconductor package of claim 1, further comprising:
   an insulating encapsulation, laterally encapsulating the semiconductor die;
   a plurality of conductive pillars, disposed on and electrically coupled to the first redistribution circuit structure, wherein the plurality of conductive pillars are next to the semiconductor die and penetrate through the insulating encapsulation; and
   a second redistribution circuit structure, disposed on the insulating encapsulation and electrically coupled to the plurality of conductive pillars and the semiconductor die,
   wherein the first redistribution circuit structure is electrically coupled to the second redistribution circuit structure through the plurality of conductive pillars.

7. The semiconductor package of claim 6, wherein a sidewall of the electrically conductive structure is free of the insulating encapsulation.

8. The semiconductor package of claim 6, wherein a sidewall of the electrically conductive structure is covered by the insulating encapsulation.

9. The semiconductor package of claim 6, further comprising at least one of:
   a plurality of first terminals, disposed on and connected to the first redistribution circuit structure, wherein the first redistribution circuit structure is disposed between and electrically connected to the plurality of first terminals and the plurality of conductive pillars; or
   a plurality of second terminals, disposed on and connected to the second redistribution circuit structure, wherein the second redistribution circuit structure is disposed between and electrically connected to the plurality of second terminals and the plurality of conductive pillars.

10. A semiconductor package, comprising:
    a backside redistribution circuit structure, comprising:
       a first dielectric layer; and
       a conductive layer, at least laterally covered by first dielectric layer, wherein portions of the conductive layer are exposed by the first dielectric layer;
    a semiconductor die, disposed over a first portion of the portions of the conductive layer comprised in the backside redistribution circuit structure exposed by the first dielectric layer;
    an insulating encapsulation, laterally encapsulating the semiconductor die; and
    an electrically conductive structure, connecting a non-active side of the semiconductor die to the first portion, wherein the semiconductor die is thermally coupled to the backside redistribution circuit structure through the electrically conductive structure, wherein the electrically conductive structure is protruding out of an outermost surface of the backside redistribution circuit structure in a cross-section of the semiconductor package, wherein the electrically conductive structure includes a structure of multi-layer with different materials, wherein in the cross-section, a sidewall of the semiconductor die is aligned with a sidewall of the electrically conductive structure, and wherein a projection of the semiconductor die is disposed within a projection of the backside redistribution circuit structure in a stacking direction of the semiconductor die and the backside redistribution circuit structure.

11. The semiconductor package of claim 10, wherein the backside redistribution circuit structure further comprises a second dielectric layer disposed on the first dielectric layer and the conductive layer, and the first portion is further at least partially exposed by the second dielectric layer.

12. The semiconductor package of claim 10, further comprising:
a plurality of conductive pillars, disposed on and electrically coupled to second portions of the portions of the conductive layer comprised in the backside redistribution circuit structure exposed by the first dielectric layer, wherein the plurality of conductive pillars are next to the semiconductor die and penetrate through the insulating encapsulation;
frontside redistribution circuit structure, disposed on the insulating encapsulation and electrically coupled to the plurality of conductive pillars and the semiconductor die; and
a plurality of conductive terminals, disposed on and connected to the frontside redistribution circuit structure, wherein the frontside redistribution circuit structure is disposed between and electrically connected to the plurality of conductive terminals and the plurality of conductive pillars, wherein the backside redistribution circuit structure is electrically coupled to the frontside redistribution circuit structure through the plurality of conductive pillars, and
wherein a sidewall of the electrically conductive structure is at least partially covered by the insulating encapsulation.

13. The semiconductor package of claim 10, wherein a thickness of the insulating encapsulation is less than a sum of a thickness of the semiconductor die and a thickness of the electrically conductive structure in the stacking direction.

14. The semiconductor package of claim 10, further comprising:
a plurality of additional conductive terminals, disposed on and connected to the backside redistribution circuit structure, wherein the backside redistribution circuit structure is disposed between the plurality of additional conductive terminals and the semiconductor die.

15. A method of manufacturing a semiconductor package, comprising:
providing a semiconductor die disposed with an electrically conductive structure at a non-active side of the semiconductor die, wherein the electrically conductive structure includes a structure of multi-layer with different materials:
forming a first redistribution circuit structure; and
disposing the semiconductor die over the first redistribution circuit structure through the electrically conductive structure, the semiconductor die being electrically coupled to the first redistribution circuit structure, and the electrically conductive structure connecting the non-active side of the semiconductor die to a conductive feature of the first redistribution circuit structure exposed by a recess confined in the first redistribution circuit structure, wherein the semiconductor die is thermally coupled to the first redistribution circuit structure through the electrically conductive structure, wherein the recess has a bottom and a sidewall, the sidewall surrounding and joined to the bottom, the bottom being within the first redistribution circuit structure wherein in a cross-section of the semiconductor package, the conductive feature of the first redistribution circuit structure continuously extends onto and contacts the electrically conductive structure disposed on the bottom of the recess.

16. The method of claim 15, further comprising:
disposing a plurality of conductive pillars on the first redistribution circuit structure next to the semiconductor die, the plurality of conductive pillars being electrically coupled to the first redistribution circuit structure;
laterally encapsulating the plurality of conductive pillars and the semiconductor die in an insulating encapsulation;
forming a second d redistribution circuit structure over the insulating encapsulation, the second redistribution circuit structure being electrically coupled to the semiconductor die, the plurality of the conductive pillars, and the first redistribution circuit structure; and
disposing a plurality of conductive terminals over the second redistribution circuit structure, the plurality of conductive terminals electrically coupled to the second redistribution circuit structure, wherein the second redistribution circuit structure is disposed between the plurality of conductive terminals and the insulating encapsulation.

17. The method of claim 15, wherein providing the semiconductor die disposed with the electrically conductive structure comprises:
providing a wafer comprising a plurality of the semiconductor dies interconnected to each other, wherein the wafer has a front surface and a rear surface opposite to the front surface, and the rear surface comprise the non-active side of each of the plurality of the semiconductor dies;
conformally forming a first conductive material over the rear surface of the wafer;
conformally forming a second conductive material over the first conductive material, the first conductive material being disposed between the wafer and the second conductive material; and
performing a dicing process to cut through the wafer, the first conductive material, and the second conductive material to form the semiconductor die, a first conductive layer and a second conductive layer, respectively, wherein the first conductive layer and the second conductive layer constitute the electrically conductive structure disposed on the non-active side of the semiconductor die.

18. The method of claim 17, wherein providing the semiconductor die disposed with the electrically conductive structure further comprises:
conformally forming a third conductive material over the second conductive material, the second conductive material being disposed between the first conductive material and the third conductive material, prior to performing the dicing process,
wherein performing the dicing process comprises cutting through the wafer, the first conductive material, the second conductive material, and the third conductive material to form the semiconductor die, the first conductive layer, the second conductive layer and a third conductive layer, respectively, wherein the electrically conductive structure disposed on the non-active side of the semiconductor die is further constituted by the third conductive layer.

19. The method of claim 18, wherein providing the semiconductor die disposed with the electrically conductive structure further comprises:

performing a planarizing process to the rear surface of the wafer to remove a portion of the first conductive material, a portion of the second conductive material, and a portion of the third conductive material to level a surface of the first conductive material, a surface of the second conductive material and a surface of the third conductive material with a surface of a substrate of the wafer, prior to performing the dicing process.

20. The method of claim 17, wherein providing the semiconductor die disposed with the electrically conductive structure further comprises:

forming a third conductive layer over the second conductive layer by dipping process, the second conductive layer being disposed between the first conductive layer and the third conductive layer, wherein the electrically conductive structure disposed on the non-active side of the semiconductor die is further constituted by the third conductive layer.

* * * * *